US009912339B2

(12) United States Patent
Chindo

(10) Patent No.: US 9,912,339 B2
(45) Date of Patent: Mar. 6, 2018

(54) ATOMIC OSCILLATOR

(71) Applicant: Seiko Epson Corporation, Tokyo (JP)

(72) Inventor: Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/283,742

(22) Filed: Oct. 3, 2016

(65) Prior Publication Data

US 2017/0099060 A1    Apr. 6, 2017

(30) Foreign Application Priority Data

Oct. 6, 2015    (JP) .................................. 2015-198261

(51) Int. Cl.

| | | |
|---|---|---|
| *H03B 17/00* | (2006.01) | |
| *H03L 7/26* | (2006.01) | |
| *H01S 1/00* | (2006.01) | |
| *G04F 5/14* | (2006.01) | |
| *H01S 1/06* | (2006.01) | |

(52) U.S. Cl.
CPC .................. *H03L 7/26* (2013.01); *G04F 5/14* (2013.01); *H01S 1/00* (2013.01); *H01S 1/06* (2013.01); *H03B 17/00* (2013.01)

(58) Field of Classification Search
CPC .................. G01N 21/77; G01N 33/18; G01N 2021/7793; G01N 21/15; G01N 21/6428; G01N 21/78; G01N 21/8507; G01N 21/88; G01N 31/22; G01N 15/1484; G01N 2015/149; G01N 21/1702; G01N 29/2418; G01N 15/14; H03L 7/26; H01S 1/06; H01S 1/00; H03B 17/00
USPC ...................................... 331/3, 94.1; 250/251
See application file for complete search history.

(56) References Cited

U.S. PATENT DOCUMENTS

| | | |
|---|---|---|
| 6,320,472 B1 | 11/2001 | Vanier |
| 6,806,784 B2 | 10/2004 | Hollberg et al. |
| 9,319,056 B2 | 4/2016 | Chindo |
| 2001/0035795 A1 | 11/2001 | Matsuura et al. |

FOREIGN PATENT DOCUMENTS

| | | |
|---|---|---|
| JP | 2001-308416 A | 11/2001 |
| JP | 2007-324818 A | 12/2007 |
| JP | 2015-122597 A | 7/2015 |
| WO | WO-2006-017345 A2 | 2/2006 |

*Primary Examiner* — Arnold Kinkead
(74) *Attorney, Agent, or Firm* — Harness, Dickey & Pierce, P.L.C.

(57) ABSTRACT

An atomic oscillator includes a gas cell that has metal atoms sealed therein, a heating unit that heats the gas cell, a heat transmission unit that is positioned between the gas cell and the heating unit, is thermally connected to the gas cell, and transmits heat generated by the heating unit to the gas cell, and a light absorbing unit that is thermally connected to the gas cell so as to be separated from the heat transmission unit and absorbs heat of the gas cell. The heat transmission unit includes a gas cell accommodation portion including at least a pair of gas cell accommodation walls disposed outside the gas cell, and a thermal conductive elastic member which is interposed in a gap formed by the gas cell and the gas cell accommodation walls of the heat transmission unit.

4 Claims, 12 Drawing Sheets

ATOMIC OSCILLATOR

CROSS REFERENCE TO RELATED APPLICATION

This application claims the benefit of Japanese Patent Application No. 2015-198261, filed on Oct. 6, 2015. The disclosure of the prior application is hereby incorporated by reference herein in its entirety.

BACKGROUND

1. Technical Field

The present invention relates to an atomic oscillator.

2. Related Art

As an oscillator having high-accuracy oscillation characteristics on a long-term basis, an atomic oscillator is known which oscillates on the basis of energy transfer of atoms of an alkali metal such as rubidium or cesium. In general, an operating principle of the atomic oscillator is classified broadly into a method using a double resonance phenomenon based on light and microwaves and a method using a quantum interference effect (CPT: coherent population trapping) based on two types of light beams having different wavelengths.

In any type of atomic oscillator, an alkali metal is sealed in a gas cell together with a buffer gas, and the gas cell is required to be heated to a predetermined temperature by a heater in order to maintain the alkali metal in a gaseous state. Here, in general, the alkali metal within the gas cell partially changes to liquid as a surplus portion without being wholly gasified. Such surplus alkali metal atoms change to liquid by separating (condensing) out to a low temperature portion of the gas cell. However, when the alkali metal atoms are present in a region through which excitation light passes, the atoms shield the excitation light, which results in a deterioration in oscillation characteristics of the atomic oscillator.

Consequently, in a gas cell disclosed in JP-A-2007-324818, a concave portion for separating an alkali metal is provided at a position away from an optical axis of excitation light. A portion apart from the concave portion of the gas cell is heated by a heater, thereby making the temperature of the concave portion lower than that of the peripheral portion thereof. Thus, a surplus portion of the alkali metal is stored in the concave portion as liquid, which preventing the surplus portion from shielding the excitation light.

However, in a case where the atomic oscillator disclosed in JP-A-2007-324818 is made small, heat generated by the heater is transmitted to the entire atomic oscillator depending on the size of the atomic oscillator. For this reason, even the temperature of the concave portion rises. As a result, the surplus portion of the alkali metal is not stored in the concave portion as liquid, and thus there is the possibility of the surplus portion shielding the excitation light. In this manner, it is difficult to partially change the temperature of the gas cell of the atomic oscillator which is reduced in size.

JP-A-2015-122597 discloses a quantum interference device which is included in an atomic oscillator. The quantum interference device disclosed in JP-A-2015-122597 includes a heating unit that transmits heat, which is supplied from the heating unit, to a gas cell and a heat radiation unit that forms a low temperature portion in the gas cell, thereby preventing a surplus portion of an alkali metal from condensing on a path through which excitation light passes. Therefore, it is possible to obtain the quantum interference device with high reliability.

In the quantum interference device disclosed in JP-A-2015-122597, heat movement (heat transmission) is performed in the heating unit connected to the gas cell or the heat radiation unit due to a close contact between the gas cell and a connection portion. However, as is well known, so-called "variations in dimensions" occur at the time of manufacturing a component. Variations also occur in a gap between the gas cell and the heating unit or a gap between the gas cell and the heat radiation unit due to the variations in dimensions. For example, when the gap becomes larger, an air layer formed in the gap serves as a heat insulating layer, which remarkably degrading the efficiency of heating or heat radiation of the gas cell. In particular, the degradation in the efficiency of heat transmission in the heating unit destabilizes the temperature of the gas cell, thereby reducing the reliability of the quantum interference device. Alternatively, in a state where components overlap each other without a gap formed therebetween and interfere with each other, a large load is applied to a glass gas cell, which leads to a concern that the gas cell may be damaged or broken.

SUMMARY

An advantage of some aspects of the invention is to provide an atomic oscillator that prevents a gas cell from being damaged in spite of the occurrence of variations in dimensions and has a high operational stability without impairing the efficiency of heat transmission from a heating unit to the gas cell.

The invention can be implemented as the following forms or application examples.

Application Example 1

An atomic oscillator according to this application example includes a gas cell that has metal atoms sealed therein, a heating unit that heats the gas cell, a heat transmission unit that is positioned between the gas cell and the heating unit, is thermally connected to the gas cell, and transmits heat generated by the heating unit to the gas cell, and a light absorbing unit that is thermally connected to the gas cell so as to be separated from the heat transmission unit and absorbs heat of the gas cell. The heat transmission unit includes a gas cell accommodation portion including gas cell accommodation walls disposed outside the gas cell, and a thermal conductive elastic member which is interposed in a gap formed by the gas cell and the gas cell accommodation walls of the heating unit.

According to the atomic oscillator of this application example, it is possible to effectively form a low temperature portion having a temperature lower than that of a peripheral portion thereof even in a gas cell which is reduced in size. Accordingly, it is possible to condense metal atoms in the low temperature portion and to store a surplus portion as liquid. In this manner, the surplus portion can be easily controlled, and thus it is possible to easily prevent the surplus portion from shielding a light path of excitation light and to increase the reliability of a quantum interference device.

Further, a reduction in the size of the gas cell leads to a reduction in the thickness of a material constituting the gas cell, and thus it is necessary to provide a gap between the gas cell and the gas cell accommodation wall of the heat transmission unit in order to avoid the damage of the gas cell which is caused by interference between components due to manufacturing variations of the gas cell accommodation wall and the gas cell. However, the gap between the gas cell accommodation wall and the gas cell serves as a region in which gas such as air is present, and thus the performance of heat transmission from the gas cell accommodation wall to the gas cell is degraded. Consequently, it is possible to secure a heat transmission path from the gas cell accommodation wall to the gas cell by disposing the thermal conductive elastic member in the gap between the gas cell accommodation wall and the gas cell and to stably fix the gas cell between the gas cell accommodation walls by elasticity of the thermal conductive elastic member.

Application Example 2

In the application example, the thermal conductive elastic member may be a rubber-based adhesive, a packing, or a sheet piece.

According to this application example, it is possible to dispose the gas cell within the gas cell accommodation walls and to then easily dispose the thermal conductive elastic member in the gap formed between the gas cell accommodation wall and the gas cell.

Application Example 3

In the application example, the thermal conductive elastic member may be a rubber-based filler.

According to this application example, it is possible to dispose the gas cell within the gas cell accommodation walls and to then easily dispose the fillable thermal conductive elastic member in the gap by filling even when variations occur in the gap formed between the gas cell accommodation wall and the gas cell.

Application Example 4

In the application example, the atomic oscillator may further include a coil that generates a magnetic field passing through the gas cell, and a magnetic shield that accommodates the gas cell, the heat transmission unit, the light absorbing unit, and the coil therein, the heat transmission unit and the light absorbing unit may be thermally connected to the magnetic shield, and the heating unit may be thermally connected to an outside of the magnetic shield.

According to this application example, it is possible to generate a magnetic field passing through the gas cell by electrifying the coil and to improve a resolution by widening a gap between different energy levels at which the atoms of an alkali metal present within the gas cell degenerate by Zeeman splitting, thereby allowing a line width of an electromagnetically induced transparency (EIT) signal to be reduced. In order to stabilize the magnetic field generated from the coil, a magnetic shield, other than the coil, for preventing a line of magnetic force from the outside from being infiltrated into the gas cell is provided.

In addition, the heating unit, the heat transmission unit, and the light absorbing unit are thermally connected to a magnetic shield connected to the air, and thus it is possible to diffuse heat generated by the heating unit from a connection portion between the heating unit and the magnetic shield in a wide range along the shape of the magnetic shield and to transmit a larger amount of light beams to the heat transmission unit. On the other hand, the light absorbing unit is thermally connected to the magnetic shield, and thus it is possible to form a wide region in which heat is radiated to the air in the magnetic shield and to effectively radiate heat transmitted to the light absorbing unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the accompanying drawings.

First Embodiment

Figure 1:
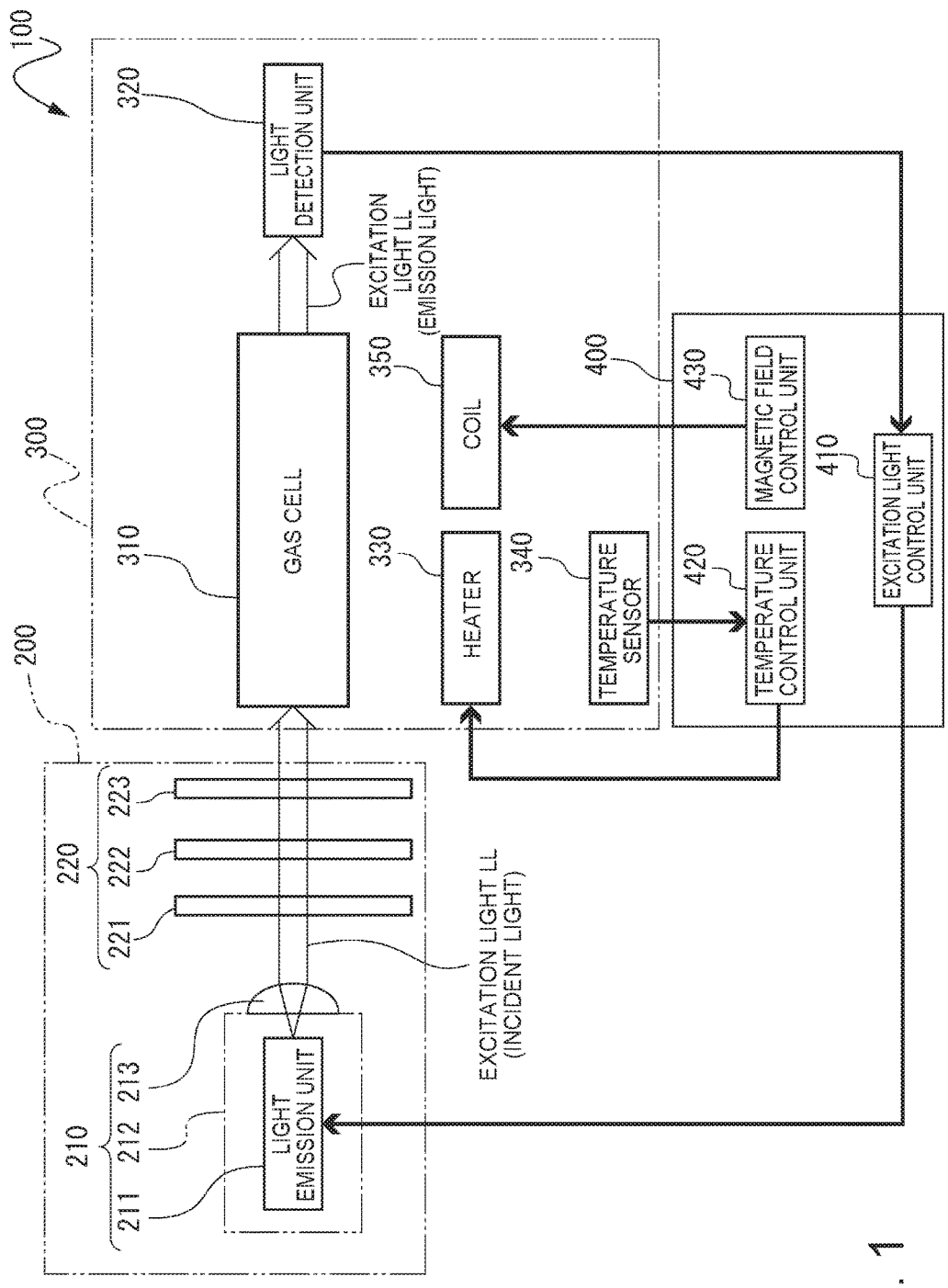
FIG. 1 is a diagram showing a schematic configuration of an atomic oscillator according to a first embodiment.
Figure 2:
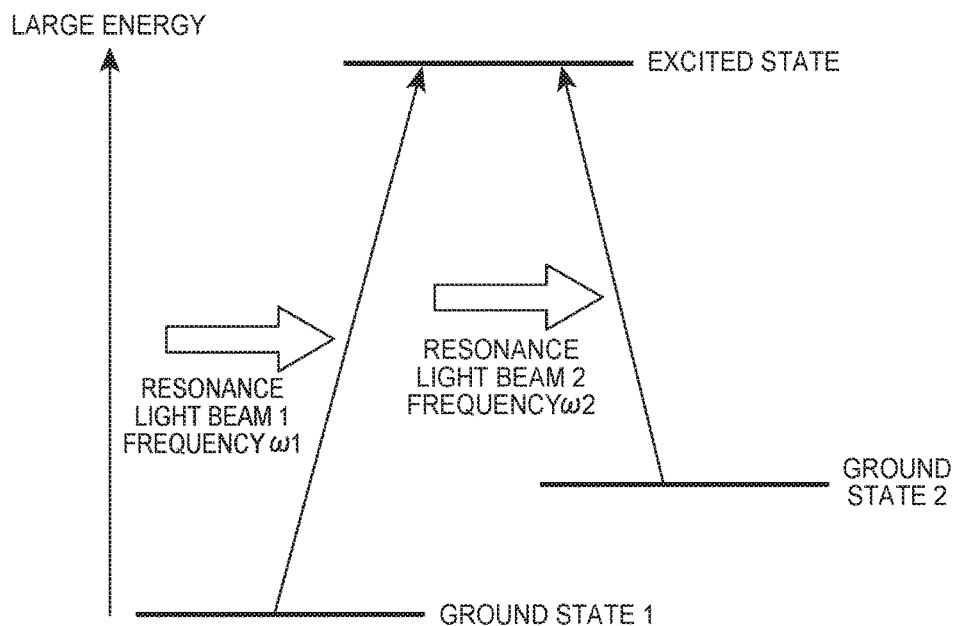
FIG. 2 is a diagram showing an energy state of an alkali metal.
Figure 3:
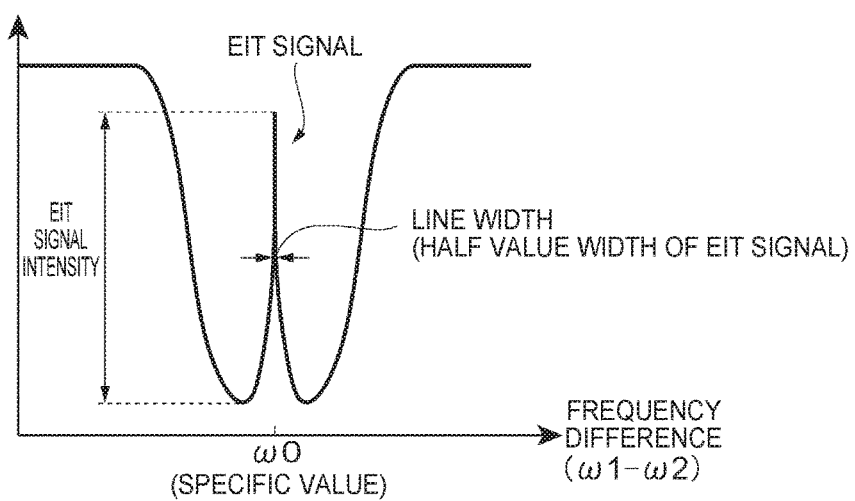
FIG. 3 is a graph showing a relationship between intensity of light detected by a light detection unit and a frequency difference between two light beams emitted from a light emission unit.

FIG. 1 is a diagram showing a schematic configuration of an atomic oscillator according to a first embodiment. In addition, FIG. 2 is a diagram showing an energy state of an alkali metal, and FIG. 3 is a graph showing a relationship between intensity of light detected by a light detection unit and a frequency difference between two light beams emitted from a light emission unit.

An atomic oscillator 100 shown in FIG. 1 is an atomic oscillator using a quantum interference effect. As shown in FIG. 1, the atomic oscillator 100 includes a first unit 200 which is a unit on the light emission side, a second unit 300 which is a unit on the light detection side, and a control unit 400 that controls the first unit 200 and the second unit 300.

The first unit 200 includes a light emission device 210 and an optical component group 220. The light emission device includes a light emission unit 211 and a first package 212 that accommodates the light emission unit 211 and includes a window portion 213 transmitting light. In addition, the second unit 300 includes a gas cell 310, a light detection unit 320, a coil 350, a heater 330 as a heating unit, a temperature sensor 340, a heat transmission unit to be described later, a light absorbing unit, and a magnetic shield that accommodates these components.

First, the principle of the atomic oscillator 100 will be briefly described. As shown in FIG. 1, in the atomic oscillator 100, the light emission unit 211 emits an excitation light LL toward the gas cell 310, and the excitation light LL passing through the gas cell 310 is detected by the light detection unit 320. A gaseous alkali metal (metal atoms) is sealed in the gas cell 310. As shown in FIG. 2, the alkali metal has an energy level of a three-level system, and can take three states of two ground states (ground states 1 and 2) having different energy levels and an excited state. Here, the ground state 1 is an energy state which is lower than the ground state 2.

The excitation light LL emitted from the light emission unit 211 includes two types of resonance light beams 1 and 2 having different frequencies. When the above-described gaseous alkali metal is irradiated with the two types of resonance light beams 1 and 2, the light absorptivity (light transmittance) of the resonance light beams 1 and 2 in the alkali metal changes in accordance with a difference ($\omega_1 - \omega_2$) between a frequency $\omega_1$ of the resonance light beam 1 and a frequency $\omega_2$ of the resonance light beam 2. When the difference ($\omega_1 - \omega_2$) between the frequency $\omega_1$ of the resonance light beam 1 and the frequency $\omega_2$ of the resonance light beam 2 is coincident with a frequency equivalent to an energy difference between the ground state 1 and the ground state 2, excitation to the excited state from each of the ground states 1 and 2 is stopped. At this time, both the resonance light beams 1 and 2 pass without being absorbed into the alkali metal. Such a phenomenon is referred to as a CPT phenomenon or an electromagnetically induced transparency (EIT) phenomenon.

For example, when the difference ($\omega_1 - \omega_2$) between the frequency $\omega_1$ of the resonance light beam 1 and the frequency $\omega_2$ of the resonance light beam 2 is coincident with a frequency $\omega_0$ equivalent to an energy difference between the ground state 1 and the ground state 2 in a case where the light emission unit 211 fixes the frequency $\omega_1$ of the resonance light beam 1 and changes the frequency $\omega_2$ of the resonance light beam 2, the detection intensity of the light detection unit 320 sharply increases as shown in FIG. 3. Such a sharp signal is detected as an EIT signal. The EIT signal has an eigen value which is determined in accordance with the type of alkali metal. Therefore, it is possible to configure an oscillator by using such an EIT signal.

Figure 4:
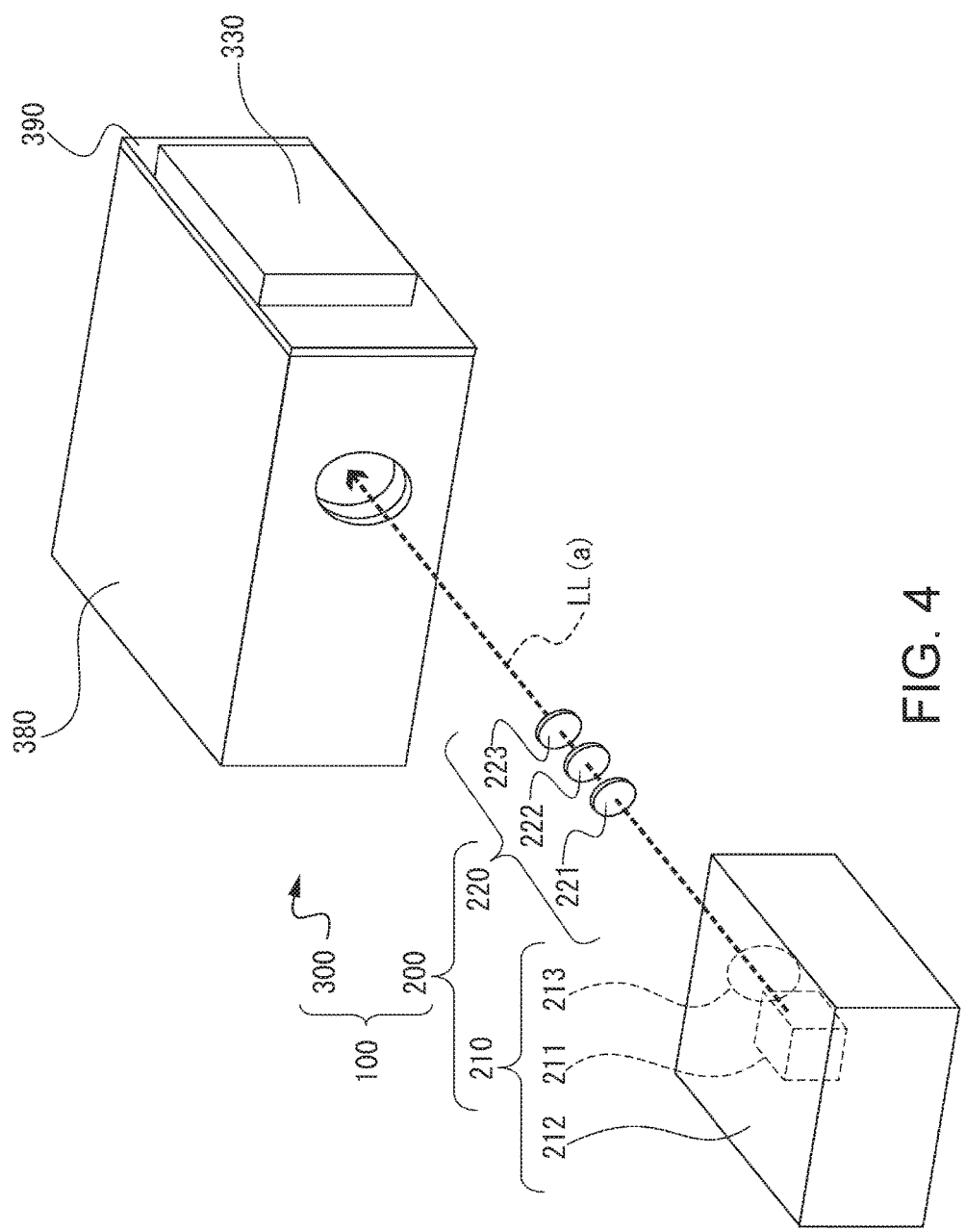
FIG. 4 is a schematic perspective view showing the atomic oscillator according to the first embodiment.
Figure 5:
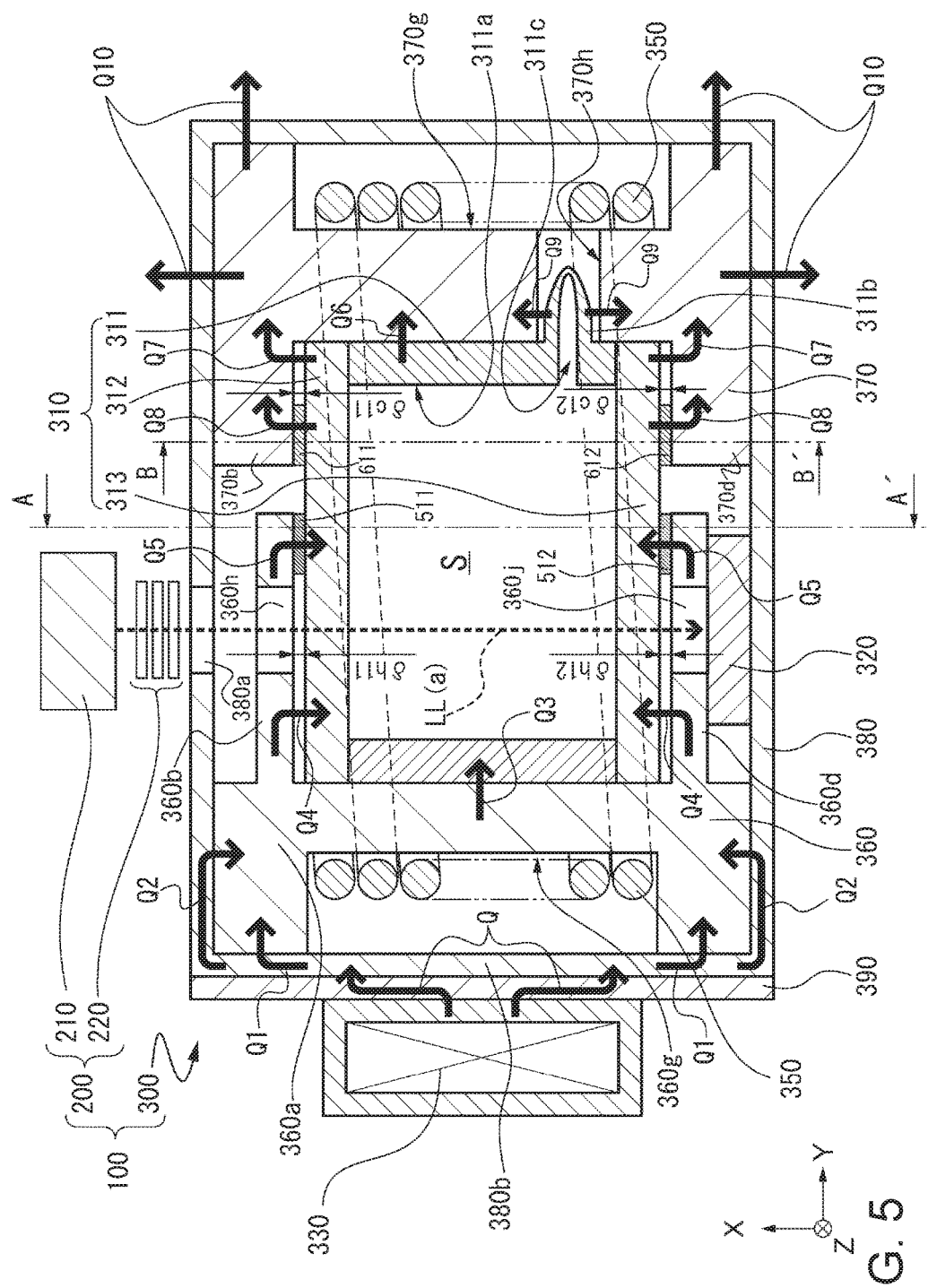
FIG. 5 is a cross-sectional view of a second unit included in the atomic oscillator according to the first embodiment.

Hereinafter, a specific configuration of the atomic oscillator 100 of this embodiment will be described. FIG. 4 is a schematic perspective view showing the atomic oscillator 100 shown in FIG. 1, and FIG. 5 is a cross-sectional view of the second unit 300 included in the atomic oscillator 100 shown in FIG. 1. In FIG. 5, for convenience of description, an X-axis, a Y-axis, and a Z-axis are shown as three axes perpendicular to each other. A distal end side of each arrow shown in the drawing is set to a "+ (positive) side" and a base end side is set to be a "− (negative) side". In addition, hereinafter, for convenience of description, a direction along the X-axis is referred to as an "X-axis direction", a direction along the Y-axis is referred to as a "Y-axis direction", and a direction along the Z-axis is referred to as a "Z-axis direction".

As shown in FIG. 4, the atomic oscillator 100 includes the first unit 200, the second unit 300, and the control unit 400 (not shown in FIG. 4. See FIG. 1). The first unit 200 and the second unit 300 are electrically connected to the control unit 400 through a wiring and a connector (not shown), and the driving thereof is controlled by the control unit 400.

The first unit 200 includes the light emission device 210 and the optical component group 220. The light emission device includes the light emission unit 211, the first package 212 accommodating the light emission unit 211, and the window portion 213.

The light emission unit 211 has a function of emitting the excitation light LL for exciting the alkali metal atoms in the gas cell 310. Specifically, the light emission unit 211 is used to emit light, which includes the above-described two types of light beams (the resonance light beam 1 and the resonance light beam 2) having different frequencies, as the excitation light LL. The frequency $\omega_1$ of the resonance light beam 1 is capable of exciting (resonating) the alkali metal in the gas cell 310 to an excited state from the above-described ground state 1. In addition, the frequency $\omega_2$ of the resonance light beam 2 is capable of exciting (resonating) the alkali metal in the gas cell 310 to an excited state from the above-described ground state 2.

The light emission unit 211 is not particularly limited as long as the unit is capable of emitting the above-described excitation light LL, but a semiconductor laser such as a vertical cavity surface emitting laser (VCSEL) can be used as the unit. In addition, the temperature of the light emission unit 211 is adjusted to a predetermined temperature using a temperature adjusting element (a heating resistor, a Peltier element, or the like) not shown in the drawing.

The first package 212 accommodates the light emission unit 211 mentioned above. For example, as shown in FIG. 4, the first package 212 is constituted by a housing having an external shape being a block shape. In addition, for example, a plurality of leads (not shown) protrude from the first package 212 and are electrically connected to the light emission unit 211 through wirings. The leads are electrically connected to a wiring board using a connector not shown in the drawing, or the like. For example, a flexible substrate or a connector having a socket shape can be used as the connector. In addition, a wall portion of the first package 212 on the second unit 300 side is provided with the window portion 213. The window portion 213 is provided on an optical axis (axis a of the excitation light LL) between the gas cell 310 and the light emission unit 211. The window portion 213 has light transmittance with respect to the excitation light LL mentioned above.

In this embodiment, the window portion 213 is a lens. Thereby, it is possible to irradiate the gas cell 310 with the excitation light LL without waste. In addition, the window portion 213 has a function of making the excitation light LL into parallel light. That is, the window portion 213 is a collimate lens, and the excitation light LL in an internal space S of the gas cell 310 to be described later is parallel light. Thereby, it is possible to increase the number of alkali metal atoms resonating by the excitation light LL emitted from the light emission unit 211 among alkali metal atoms which are present in the internal space S. As a result, it is possible to increase the intensity of an EIT signal.

Meanwhile, the window portion 213 is not limited to a lens as long as it is a portion having light transmittance with respect to the excitation light LL. For example, the window portion may be an optical component other than a lens, or may be a simple light transmissive plate-shaped member. In this case, a lens having the above-described function may be provided between the first package 212 and a magnetic shield 380 to be described later similar to, for example, optical components 221, 222, and 223 constituting the optical component group 220 to be described later. A constituent material of a portion of the first package 212 other than the window portion 213 is not particularly limited. For example, ceramics, a metal, or a resin can be used as the constituent material.

In addition, in a case where a portion of the first package 212 other than the window portion 213 is formed of a material having light transmittance with respect to the excitation light LL, it is possible to integrally form the window portion 213 and the portion of the first package 212 other than the window portion 213. Meanwhile, in a case where the portion of the first package 212 other than the window portion 213 is formed of a material that does not have light transmittance with respect to the excitation light LL, the window portion 213 and the portion of the first package 212 other than the window portion 213 may be formed as separate bodies and may be bonded to each other using a known bonding method.

In addition, it is preferable that the inside of the first package 212 is an airtight space. Thereby, it is possible to set the inside of the first package 212 to be in a decompression state or a state where an inert gas is sealed. As a result, it is possible to improve the characteristics of the atomic oscillator 100. In addition, a temperature adjusting element or a temperature sensor which adjusts the temperature of the light emission unit 211 may be accommodated in the first package 212 (not shown). Examples of the temperature adjusting element include a heating resistor (heater), a Peltier element, and the like. According to the first package 212, it is possible to accommodate the light emission unit 211 in the first package 212 while allowing the emission of the excitation light LL to the outside of the first package 212 from the light emission unit 211.

The second unit 300 includes the magnetic shield 380, which accommodates the above-described gas cell 310, the light detection unit 320, the coil 350, a heat transmission unit 360, and a light absorbing unit 370, the heater 330, and the temperature sensor 340.

An alkali metal such as gaseous rubidium, cesium, or sodium is sealed in the gas cell 310. In addition, a rare gas such as argon or neon and an inert gas such as nitrogen may be sealed as a buffer gas in the gas cell 310 together with an alkali metal gas, when necessary.

As shown in FIG. 5, the gas cell 310 included in the atomic oscillator 100 according to this embodiment includes a main body 311 having a through hole 311a, and a pair of window portions 312 and 313 as light transmitting portions that close both openings of the both sides of the through hole 311a and include a transmission region through which the excitation light LL can pass. Thereby, the above-described internal space S having an alkali metal sealed therein is formed. In addition, a protrusion portion 311b protruding outwards is formed in a portion of the main body 311, and the inside of the protrusion portion 311b functions as a liquid reserving portion 311c. The liquid reserving portion 311c is a portion in which a portion of an alkali metal is stored in a liquid phase as a surplus portion. As described later, the temperature of the liquid reserving portion 311c is made lower than the temperature of the peripheral portion thereof, and thus it is possible to store the surplus portion of the alkali metal in the liquid reserving portion 311c with the surplus portion being condensed.

A material constituting the main body 311 is not particularly limited, but includes a metal material, a resin material, a glass material, a silicon material, quartz crystal, and the like. From the viewpoint of processability and bonding between the window portions 312 and 313, a glass material and a silicon material are preferably used. The window portions 312 and 313 are airtightly bonded to such a main body 311. Thus, it is possible to make the internal space S of the gas cell 310 into an airtight space.

A method of bonding the main body 311 and the window portions 312 and 313 is determined in accordance with the constituent materials thereof, and is not particularly limited. For example, a bonding method using an adhesive, a direct bonding method, and an anodic bonding method can be used as the method. In addition, a material constituting the window portions 312 and 313 is not particularly limited as long as the material has light transmittance with respect to the excitation light LL mentioned above. From the viewpoint of bonding to the main body 311, examples of the material include a silicon material, a glass material, quartz crystal, and the like, and the same material as that of the main body 311 is preferably used.

The window portions 312 and 313 have light transmittance with respect to the excitation light LL from the light emission device 210 mentioned above. One window portion 312 transmits the excitation light LL entering the gas cell 310, and the other window portion 313 transmits the excitation light LL emitted from the gas cell 310. The gas cell 310 is heated by the heater 330, and the temperature thereof is adjusted to a predetermined temperature.

The light detection unit 320 has a function of detecting the intensity of the excitation light LL (resonance light beams 1 and 2) passing through the gas cell 310. The light detection unit 320 is not particularly limited as long as the unit is a unit capable of detecting the above-described excitation light LL. For example, a photodetector (light-receiving element) such as a solar cell or a photodiode can be used. In addition, the light detection unit 320 is accommodated in the magnetic shield 380 in this embodiment, but may be provided outside the magnetic shield 380. In this case, a window portion transmitting the excitation light LL having passed through the gas cell 310 is formed in the magnetic shield 380.

The coil 350 generates a magnetic field in a direction along the optical axis a of the excitation light LL in the internal space S by electrical conduction, and improves a resolution by widening a gap between different energy levels at which the atoms of the alkali metal within the internal space S degenerate by Zeeman splitting, thereby allowing a line width of an EIT signal to be reduced. Meanwhile, the magnetic field generated by the coil 350 may be any of a DC magnetic field and an AC magnetic field, or may be a magnetic field in which a DC magnetic field and an AC magnetic field are superimposed on each other. The coil 350 is not particularly limited. For example, the coil may be wound around the outer circumference of the gas cell 310 so as to configure a solenoid type, or a pair of coils may face each other through the gas cell 310 so as to configure a Helmholtz type. In this embodiment, the coil 350 is configured as a solenoid type, and is wound around the heat transmission unit 360, the gas cell 310, and the light absorbing unit 370. The coil 350 is electrically connected to a magnetic field control unit 430 of the control unit 400 to be described later through a wiring not shown in the drawing, and the coil 350 is electrified.

The magnetic shield 380 is constituted by a housing having an external shape being a block shape, and accommodates the coil 350, the heat transmission unit 360, the gas cell 310, and the light absorbing unit 370 therein. The magnetic shield 380 has a magnetic shielding property and has a function of shielding the gas cell 310 from an external magnetic field. Thereby, it is possible to stabilize a magnetic field generated by the coil 350 in the magnetic shield 380. Accordingly, it is possible to achieve an improvement in the oscillation characteristics of the atomic oscillator 100.

In addition, a window portion 380a is provided in a wall portion of the magnetic shield 380 on the first unit 200 side so as to penetrate the wall portion in the thickness direction thereof, and the excitation light LL emitted from the light emission device 210 is incident on the gas cell 310 through the window portion 380a. Meanwhile, a material having a magnetic shielding property is used as the constituent material of the magnetic shield 380. Examples of the constituent material include soft magnetic materials such as Fe and various iron-based alloys (silicon iron, permalloy, amorphous, sendust, and Kovar). Among these, an Fe—Ni based alloy such as Kovar or permalloy is preferably used from the viewpoint of an excellent magnetic shielding property. In addition, a plurality of leads (not shown) electrically connected to the light detection unit 320, the heater 330, the temperature sensor 340 (not shown), and the coil 350 protrude from the magnetic shield 380, and the plurality of leads are electrically connected to a wiring board using a connector not shown in the drawing, or the like through wirings. Examples of the connector to be used include a flexible substrate, a connector having a socket shape, and the like.

The heater 330 has a function of heating an alkali metal which is airtightly sealed in the gas cell 310 mentioned above. Thereby, it is possible to maintain the alkali metal in the gas cell 310 to a gaseous state having a desired concentration. The heater 330 is heated by electrical conduction. For example, the heater is constituted by a heating resistor provided on the outer surface of the gas cell 310. Such a heating resistor is formed using, for example, a chemical vapor deposition (CVD) such as a plasma CVD or a thermal CVD, a dry plating method such as vacuum deposition, or a sol-gel method. Meanwhile, in a case where the heating resistor is provided on an incidence unit side or an emission unit side of the excitation light LL of the gas cell 310, the heating resistor is constituted by a material having light transmittance with respect to the excitation light LL, for example, a transparent electrode material such as an oxide, for example, indium tin oxide (ITO), indium zinc oxide (IZO), $In_3O_3$, $SnO_2$, $SnO_2$ containing Sb, or ZnO containing Al.

In addition, the heater 330 is connected to the magnetic shield 380 on the outer side of the magnetic shield 380 through a heat transmission plate 390 having a thermal conductivity higher than that of the magnetic shield 380. As described above, since the heater 330 generates heat by electrical conduction, a magnetic field is generated during the heat generation. However, the heater 330 is provided outside the magnetic shield 380, and thus it is possible to prevent the magnetic field generated from the heater 330 from being infiltrated into the magnetic shield 380 and to suppress influence on the magnetic field generated from the coil 350.

Meanwhile, the heater 330 is not particularly limited as long as the heater is a heater capable of heating the gas cell 310, and may not come into contact with the gas cell 310. In addition, the gas cell 310 may be heated using a Peltier element instead of the heater 330 or in conjunction with the heater 330. The heater 330 is electrically connected to the temperature control unit 420 of the control unit 400 to be described later, and thus the electrical conduction thereof is controlled.

Although not shown in FIG. 5, the atomic oscillator 100 includes the temperature sensor 340. The temperature sensor 340 detects the temperature of the heater 330 or the gas cell 310. The amount of electrical conduction to the heater 330 is controlled by the temperature control unit 420 (see FIG. 1) on the basis of detection results of the temperature sensor 340, and the temperature of the heater 330 is controlled. The gas cell 310 is maintained to a desired temperature, and thus it is possible to maintain the temperature of the alkali metal atoms in the gas cell 310 to a desired temperature. Meanwhile, an installation position of the temperature sensor 340 is not particularly limited. For example, the temperature sensor may be installed on the heater 330 or may be installed on the outer surface of the gas cell 310. The temperature sensor 340 is not particularly limited, and various types of temperature sensors such as a thermistor or a thermocouple can be used as the temperature sensor.

The first unit 200 includes the optical component group 220 constituted by the plurality of optical components 221, 222, and 223. The optical component group 220 is provided on the optical axis a of the excitation light LL between the gas cell 310 and the light emission unit 211 in the first package 212.

The optical component group 220 of this embodiment is configured such that the optical component 221, the optical component 222, and the optical component 223 are disposed in this order toward the gas cell 310 from the light emission unit 211. The optical component 221 is a λ/4 wavelength plate. Thereby, for example, the excitation light LL which is linear polarized light from the light emission unit 211 can be converted into circularly polarized light (right circularly polarized light or left circularly polarized light).

As described above, if alkali metal atoms within the gas cell 310 are irradiated with the excitation light LL which is linearly polarized light in a state where Zeeman splitting of the alkali metal atoms occurs due to a magnetic field of the coil 350 mentioned above, a plurality of levels of the alkali metal atoms having been subjected to Zeeman splitting are uniformly dispersed by interaction between the excitation light LL and the alkali metal atoms. As a result, the number of alkali metal atoms having a desired energy level becomes relatively smaller than the number of alkali metal atoms having other energy levels. Thus, the number of atoms expressing a desired EIT phenomenon is reduced, and a desired EIT signal becomes small. As a result, the oscillation characteristics of the atomic oscillator 100 are degraded.

On the other hand, as described above, when the alkali metal atoms within the gas cell 310 are irradiated with the excitation light LL which is circularly polarized light in a state where Zeeman splitting of the alkali metal atoms occurs due to a magnetic field of the coil 350 mentioned above, it is possible to make the number of alkali metal atoms having a desired energy level relatively larger than the number of alkali metal atoms having other energy levels among a plurality of levels of the alkali metal atoms having been subjected to Zeeman splitting, by interaction between the excitation light LL and the alkali metal atoms. For this reason, the number of atoms expressing a desired EIT phenomenon is increased, and a desired EIT signal becomes large. As a result, it is possible to improve the oscillation characteristics of the atomic oscillator 100.

Meanwhile, the plan-view shape of the optical component 221 is not limited thereto, and may be a polygonal shape such as, for example, a circular shape, a quadrilateral shape, or a pentagonal shape. In addition, the optical component group 220 is configured such that the optical components 222 and 223 are disposed on the second unit 300 side in addition to the optical component 221. Each of the optical components 222 and 223 is a neutral density filter (ND filter), and can reduce and adjust the intensity of the excitation light LL incident on the gas cell 310. Accordingly, even when an output of the light emission unit 211 is large, it is possible to set the amount of excitation light LL incident on the gas cell 310 to a desired amount. Meanwhile, each of the optical components 222 and 223 has a plate shape. In addition, the shape of each of the optical components 222 and 223 when seen in a plan view is not particularly limited, and may be a polygonal shape such as, for example, a circular shape, a quadrilateral shape, or a pentagonal shape. In addition, either one or both of the optical components 222 and 223 may be omitted depending on the magnitude of the output of the light emission unit 211.

The control unit 400 shown in FIG. 1 has a function of controlling the heater 330, the coil 350, and the light emission unit 211. In this embodiment, the control unit 400 is constituted by an integrated circuit (IC) chip. The control unit 400 includes an excitation light control unit 410 that controls frequencies of the resonance light beams 1 and 2 of the light emission unit 211, a temperature control unit 420 that controls the temperature of an alkali metal in the gas cell 310, and a magnetic field control unit 430 that controls a magnetic field to be applied to the gas cell 310.

The excitation light control unit 410 controls frequencies of the resonance light beams 1 and 2 emitted from the light emission unit 211 on the basis of detection results of the light detection unit 320 mentioned above. More specifically, the excitation light control unit 410 controls the frequencies of the resonance light beams 1 and 2 emitted from the light emission unit 211 so that a frequency difference ($\omega1-\omega2$) is set to a frequency $\omega0$ inherent in the alkali metal, on the basis of the detection results of the light detection unit 320.

Although not shown in the drawing, the excitation light control unit 410 includes a voltage-controlled quartz crystal oscillator (oscillation circuit) and outputs an oscillation frequency of the voltage-controlled quartz crystal oscillator as an output signal of the atomic oscillator 100 while synchronizing and adjusting the oscillation frequency on the basis of the detection results of the light detection unit 320. In addition, the temperature control unit 420 controls electrical conduction to the heater 330 on the basis of detection results of the temperature sensor 340. Thus, it is possible to maintain the gas cell 310 within a desired temperature range. In addition, the magnetic field control unit 430 controls electrical conduction to the coil 350 so that a magnetic field generated by the coil 350 becomes constant.

As shown in FIG. 5, the heat transmission unit 360 is disposed outside the gas cell 310. The heat transmission unit 360 is formed of a material having a thermal conductivity higher than that of at least the magnetic shield 380, and transmits heat generated from the heater 330 to the gas cell 310. Meanwhile, in this specification, a state where heat can be transmitted between members is referred to as a "thermally connected" state. That is, a description will be given on the assumption that members are in a "thermally connected" state as long as heat can be transmitted between the members even when the members are in a contact state or a non-contact state (for example, a state where the members are fixed using an adhesive or the like).

Figure 6:
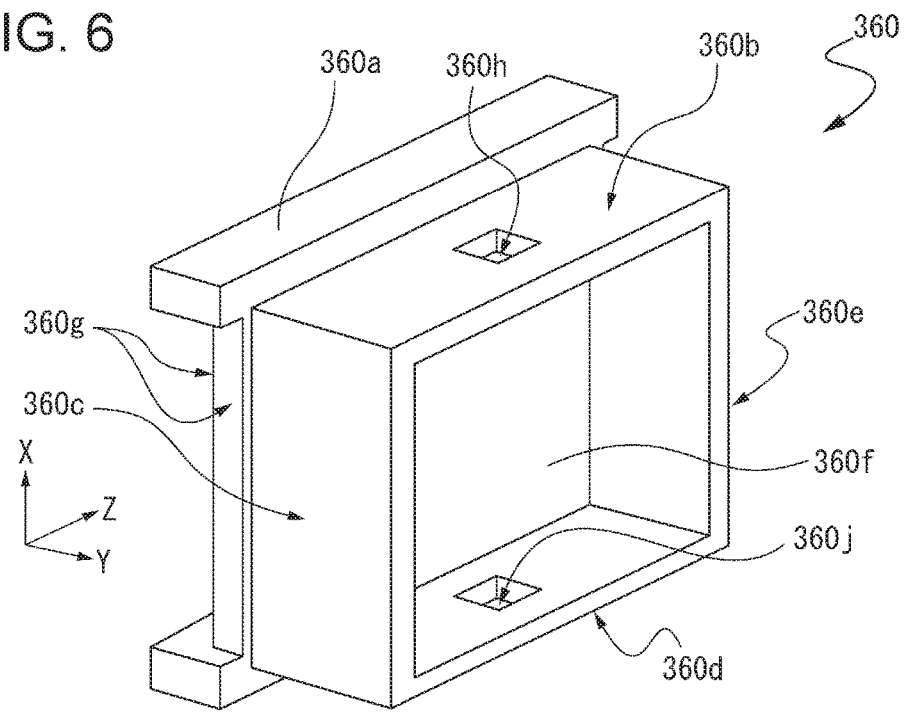
FIG. 6 is a perspective view of a heat transmission unit shown in FIG. 5.

FIG. 6 is a perspective view showing the exterior of the heat transmission unit 360. As shown in FIG. 6, the heat transmission unit 360 is constituted by a base portion 360a having a quadrilateral plate shape when seen from the Y-axis direction on the assumption that the Y-axis direction is a thickness direction, and wall portions 360b, 360c, 360d, and 360e as four gas cell accommodating walls that are erected in the Y (+) direction from an edge portion of the base portion 360a. The wall portion 360b and the wall portion 360d face each other in the X-axis direction. The wall portion 360b is positioned on the X (+) side, and the wall portion 360d is positioned on the X (−) side. In addition, the wall portion 360c and the wall portion 360e face each other in the Z-axis direction. The wall portion 360c is positioned on the Z (−) side, and the wall portion 360e is positioned on the Z (+) side. Adjacent wall portions of the wall portions 360b, 360c, 360d, and 360e are connected to each other, thereby forming a cylindrical shape as a whole. In addition, a portion surrounded by the base portion 360a and the wall portions 360b, 360c, 360d, and 360e is configured as a first concave portion 360f serving as a gas cell accommodation portion into which a portion of the gas cell 310 is inserted.

In addition, a second concave portion 360g is formed at the end on the Y (−) side in the base portion 360a so as to circulate. As also shown in FIG. 5, the second concave portion 360g is a portion in which the coil 350 wound around the outer circumferences of each of the heat transmission unit 360 and the light absorbing unit 370 is disposed. A portion of the coil 350 is disposed in the second concave portion 360g, and thus it is possible to achieve a reduction in the size of the atomic oscillator 100. Meanwhile, in the heat transmission unit 360 according to this embodiment, a description is given of a configuration in which the wall portions 360b, 360c, 360d, and 360e are formed to have a frame shape, but the invention is not limited thereto. The wall portions 360b, 360c, 360d, and 360e may not be connected to each other as long as the wall portions can accommodate the gas cell 310.

In addition, the wall portion 360b is provided with a window portion 360h which is a through hole as an opening corresponding to a transmission region of the excitation light LL in the window portion 312, and the wall portion 360d is provided with a window portion 360j which is a through hole as an opening corresponding to a transmission region of the excitation light LL in the window portion 313. The window portions 360h and 360j overlap each other so as to be able to transmit the excitation light LL (see FIG. 5) when seen from the X-axis direction. Accordingly, the excitation light LL passes through or penetrates the window portion 360h, the window portions 312 and 313 of the gas cell 310, and the window portion 360j in this order in a state where the gas cell 310 is inserted into the first concave portion 360f, and thus it is possible to make the excitation light LL incident on the light detection unit 320.

Now, heat transmission performed from the heater 330 through the heat transmission unit 360 mentioned above to the gas cell 310 will be described. As shown in FIG. 5, heat Q generated by the heater 330 is first transmitted to the heat transmission plate 390. The heat Q is transmitted to the entire heat transmission plate 390 by the heat transmission plate 390 having a high thermal conductivity, and the heat Q transmitted to the heat transmission plate 390 is transmitted and moved toward the wall portion 380b facing the heater 330 of the magnetic shield 380 connected to the heat transmission plate 390.

Subsequently, the heat Q transmitted to the wall portion 380b of the magnetic shield 380 is transmitted to the heat transmission unit 360 in a state where the heat changes to heat Q1 transmitted from the end on the Y (−) side of the base portion 360a of the heat transmission unit 360 and heat Q2 transmitted from the outer circumferential surface of the base portion 360a. The heat Q1 and Q2 transmitted to the base portion 360a is transmitted through the heat transmission unit 360, and is partially transmitted and moved to each of the wall portions 360b, 360c, 360d, and 360e. The heat Q1 and Q2 having reached each of the wall portions 360b, 360c, 360d, and 360e is transmitted to the gas cell 310 as follows.

First, the heat is transmitted, as heat Q3, from the base portion 360a to the main body 311 of the gas cell 310 connected to the bottom of the first concave portion 360f (see FIG. 6). Heat other than the heat Q3 transmitted to the gas cell 310 is transmitted to the wall portions 360b, 360c, 360d, and 360e, and is transmitted to the window portions 312 and 313 of the gas cell 310 as heat Q4 and Q5.

As described above, the gas cell 310 is inserted into the first concave portion 360f of the heat transmission unit 360. At this time, in order to enable the gas cell 310 to be inserted into the first concave portion 360f, it is necessary to provide a gap δh1 between the first concave portion 360f and the gas cell 310 as a design condition in consideration of variations during manufacturing. A reduction in the size of the gas cell 310 becomes essential in the atomic oscillator 100 desired to have a small size when the gas cell 310 is manufactured so as to have an external shape which is even slightly larger than the inner shape of the first concave portion 360f in a case where the gap δh1 is not provided in design. As a result, the main body 311 of the gas cell 310 or the window portions 312 and 313 are formed of a thinner material. Further, as described above, the main body 311 and the window portions 312 and 313 are formed using a so-called brittle material such as glass, and thus tend to be damaged or broken due to a slight stress.

Therefore, it is necessary to provide the gap δh1 from a design stage. Here, δh1 is expressed by an expression of δh1=δh11+δh12 on the assumption that a gap between the wall portion 360b and the window portion 312 of the gas cell 310 in the X-axis direction shown in FIG. 5 is δh11 and a gap between the wall portion 360d and the window portion 313 of the gas cell 310 is δh12, and expressions of 0≤δh11≤δh1 and 0≤δh12≤δh1 are established.

In the case of a transmission path of the heat Q4 shown in FIG. 5, the heat Q4 is transmitted from the wall portions 360b and 360d through the gaps δh11 and δh12 to the window portions 312 and 313 of the gas cell 310. In this case, gas, such as air, in a gas environment in the vicinity of the gas cell 310 is present in the gaps δh11 and δh12. The air has an extremely low thermal conductivity as is well known, rather has a heat insulation property. Therefore, in order to transmit heat from the heat transmission unit 360 to the gas cell 310 while suppressing a heat transmission loss, heat transmission members 511 and 512 as thermal conductive elastic members are mounted in the gaps δh11 and δh12.

Figure 7:
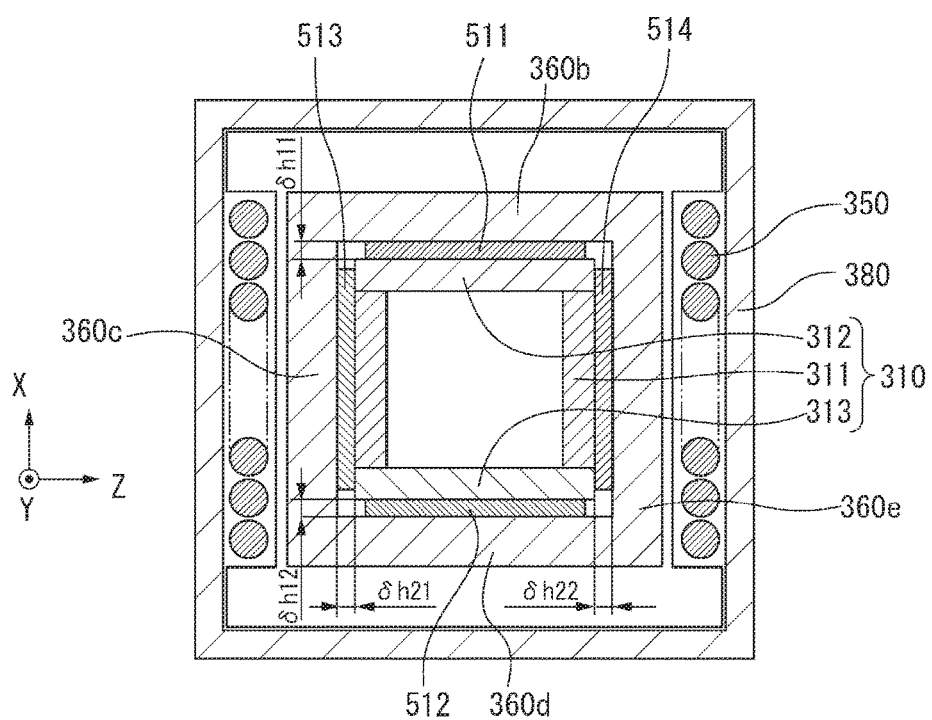
FIG. 7 is a cross-sectional view of a portion taken along line A-A' shown in FIG. 5.

A cross-section of a portion taken along line A-A' shown in FIG. 5 is shown in FIG. 7. As shown in FIG. 7, in addition to the gaps δh11 and δh12 mentioned above, a gap δh21 and a gap δh22 are also respectively set between the wall portion 360c and the gas cell 310 and between the wall portion 360e and the gas cell 310 in the Z-axis direction. Assuming that a gap in the Z-axis direction in a design stage is δh2, expressions of δh2=δh21+δh22, 0≤δh21≤δh2, and 0≤δh22≤δh2 are established.

The heat transmission member 511 is mounted in the gap δh11, the heat transmission member 512 is mounted in the gap δh12, a heat transmission member 513 is mounted in the gap δh21, and a heat transmission member 514 is mounted in the gap δh22. A material having elasticity and thermal conductivity, for example, silicon rubber, a metal filler-containing rubber, or the like is preferably used for the heat transmission members 511, 512, 513, and 514. That is, in order to transmit heat from the wall portions 360b, 360c, 360d, and 360e through the heat transmission members 511, 512, 513, and 514 to the gas cell 310, the heat transmission members 511, 512, 513, and 514 can efficiently perform heat transmission by bringing the wall portions 360b, 360c, 360d, and 360e and the gas cell 310 into close contact with each other. Therefore, the heat transmission members 511, 512, 513, and 514 have elasticity, and thus can normally operate to press the wall portions 360b, 360c, 360d, and 360e and the gas cell 310 and can bring the wall portions and the gas cell into close contact with each other.

In this manner, a loss of heat transmission performed from the wall portions 360b, 360c, 360d, and 360e through the heat transmission members 511, 512, 513, and 514 to the gas cell 310 is reduced as shown by a heat transmission path of the heat Q5 indicated by arrows in FIG. 5 by the heat transmission members 511, 512, 513, and 514 being provided, and thus it is possible to efficiently supply heat.

The light absorbing unit 370 is disposed outside the gas cell 310 as shown in FIG. 5. The light absorbing unit 370 is formed of a material having a thermal conductivity higher than that of at least the magnetic shield 380, and a surplus amount of heat in the gas cell 310 is radiated to the outside of the magnetic shield 380 through the magnetic shield 380.

Figure 8:
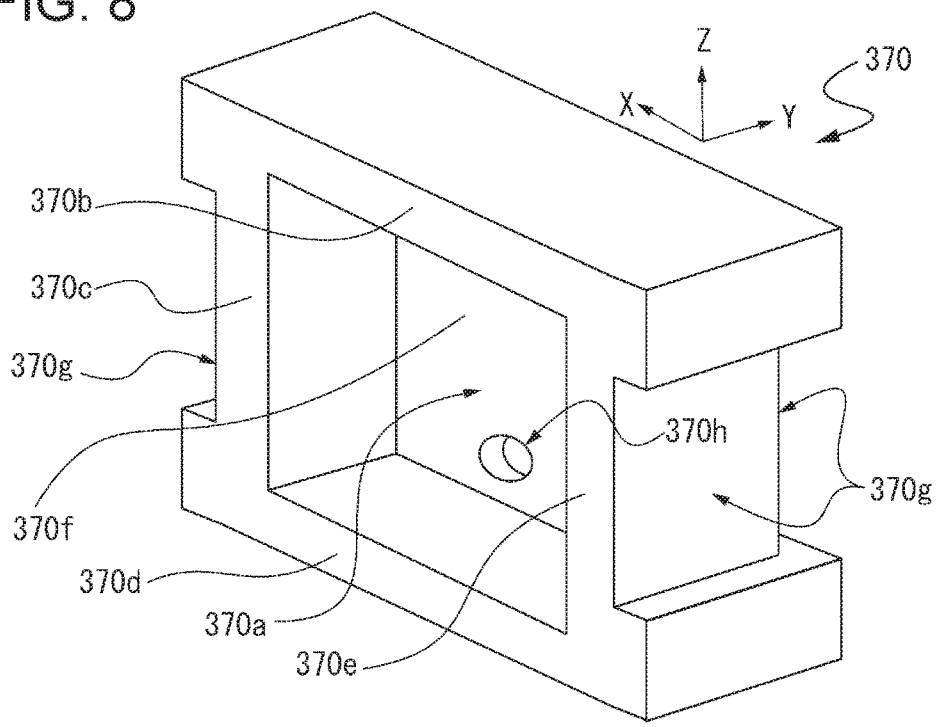
FIG. 8 is a perspective view of a light absorbing unit shown in FIG. 5.

FIG. 8 is a perspective view showing an exterior of the light absorbing unit 370. As shown in FIG. 8, the light absorbing unit 370 can be constituted by a base portion 370a having a quadrilateral plate shape when seen from the Y-axis direction on the assumption that the Y-axis direction is a thickness direction, and four wall portions 370b, 370c, 370d, and 370e serving as gas cell accommodating walls erected from the edge of the base portion 370a in the Y (−) direction. The wall portion 370b and the wall portion 370d face each other in the Z-axis direction. The wall portion 370b is positioned on the Z (+) side, and the wall portion 370d is positioned on the Z (−) side. In addition, the wall portion 370c and the wall portion 370e face each other in the X-axis direction. The wall portion 370c is positioned on the X (+) side, and the wall portion 370e is positioned on the X (−) side. Adjacent wall portions of the wall portions 370b, 370c, 370d, and 370e are connected to each other, thereby forming a cylindrical shape as a whole. In addition, a portion surrounded by the base portion 370a and the wall portions 370b, 370c, 370d, and 370e is configured as a first concave portion 370f serving as a gas cell accommodation portion into which a portion of the gas cell 310 is inserted. Meanwhile, in the light absorbing unit 370 according to this embodiment, a description is given of a configuration in which the wall portions 370b, 370c, 370d, and 370e are formed to have a frame shape, but the invention is not limited thereto. The wall portions 370b, 370c, 370d, and 370e may not be connected to each other as long as the wall portions can accommodate the gas cell 310.

In addition, a second concave portion 370g is formed in an end of the base portion 370a on the Y (+) side along the X-axis and is formed in outer ends of the wall portion 370c and the wall portion 370e along the Y-axis direction. As also shown in FIG. 5, the second concave portion 370g is a portion in which the coil 350 wound around the outer circumferences of the heat transmission unit 360 and the light absorbing unit 370 is disposed. A portion of the coil 350 is disposed in the second concave portion 370g, and thus it is possible to achieve a reduction in the size of the atomic oscillator 100.

In addition, a through hole 370h having the protrusion portion 311b of the gas cell 310 inserted thereinto is formed in the base portion 370a. Heat of the protrusion portion 311b inserted into the through hole 370h is transmitted to the light absorbing unit 370 through an inner circumferential surface of the through hole 370h. Therefore, the protrusion portion 311b is prompted to be cooled by the protrusion portion 311b being inserted into the through hole 370h of the light absorbing unit 370, and a surplus portion of alkali atoms in the gas cell 310 tends to condense within the liquid reserving portion 311c of the protrusion portion 311b, thereby allowing the atomic oscillator 100 to be stably oscillated. Meanwhile, the through hole 370h may be a concave portion having an opening on the first concave portion 370f side. In this case, the through hole has a depth that does not interfere with the protrusion portion 311b.

Heat transmission performed from the gas cell 310 through the light absorbing unit 370 mentioned above to the outside of the magnetic shield 380 will be described. As shown in FIG. 5, the heat Q generated by the heater 330 is transmitted to the heat transmission plate 390, the heat transmission unit 360, the heat transmission members 511, 512, 513, and 514, and the gas cell 310, and the temperature of the gas cell 310 is maintained to a desired temperature. However, the temperature of the gas cell 310 may rise beyond a desired temperature in an external environment at an installation location of the atomic oscillator 100, particularly, in a high temperature environment.

A unit that absorbs surplus heat from the gas cell 310 of which the temperature has risen and radiates the heat to the outside of the magnetic shield 380 through the magnetic shield 380 is the light absorbing unit 370. Although the surplus heat of the gas cell 310 is transmitted to the light absorbing unit 370, the gas cell 310 is inserted into the first concave portion 370f of the light absorbing unit 370, similar to the heat transmission unit 360.

First, the heat is transmitted, as heat Q6, from the main body 311 of the gas cell 310 connected to the bottom of the first concave portion 370f (see FIG. 8) to the base portion 370a. Heat other than the heat Q6 transmitted from the gas cell 310 to the light absorbing unit 370 is transmitted to the wall portions 370b, 370c, 370d, and 370e, and is transmitted to the light absorbing unit 370 as heat Q7 and Q8.

At this time, in order to enable the gas cell 310 to be inserted into the first concave portion 370f, it is necessary to provide a gap $\delta c1$ between the first concave portion 370f and the gas cell 310 as a design condition in consideration of variations during manufacturing. A reduction in the size of the gas cell 310 becomes essential in the atomic oscillator 100 desired to have a small size when the gas cell 310 is manufactured so as to have an external shape which is even slightly larger than the inner shape of the first concave portion 370f in a case where the gap $\delta c1$ is not provided in design. As a result, the main body 311 of the gas cell 310 or the window portions 312 and 313 are formed of a thinner material. Further, as described above, the main body 311 and the window portions 312 and 313 are formed using a so-called brittle material such as glass, and thus tend to be damaged or broken due to a slight stress.

Therefore, it is necessary to provide the gap $\delta c1$ from a design stage. Here, $\delta c1$ is expressed by an expression of $\delta c1 = \delta c11 + \delta c12$ on the assumption that a gap between the wall portion 370b and the window portion 312 of the gas cell 310 in the X-axis direction shown in FIG. 5 is $\delta c11$ and a gap between the wall portion 370d and the window portion 313 of the gas cell 310 is $\delta c12$, and expressions of $0 \leq \delta c11 \leq \delta c1$ and $0 \leq \delta c12 \leq \delta c1$ are established.

In the case of a transmission path of the heat Q7 shown in FIG. 5, the heat Q7 is transmitted from the window portions 312 and 313 of the gas cell 310 through the gaps $\delta c11$ and $\delta c12$ to the wall portions 370b and 370d. In this case, gas, such as air, in a gas environment in the vicinity of the gas cell 310 is present in the gaps $\delta c11$ and $\delta c12$. The air has an extremely low thermal conductivity as is well known, rather has a heat insulation property. Therefore, in order to transmit heat from the gas cell 310 to the light absorbing unit 370 while suppressing a heat transmission loss, heat transmission members 611 and 612 as thermal conductive elastic members are mounted in the gaps $\delta c11$ and $\delta c12$.

Figure 9:
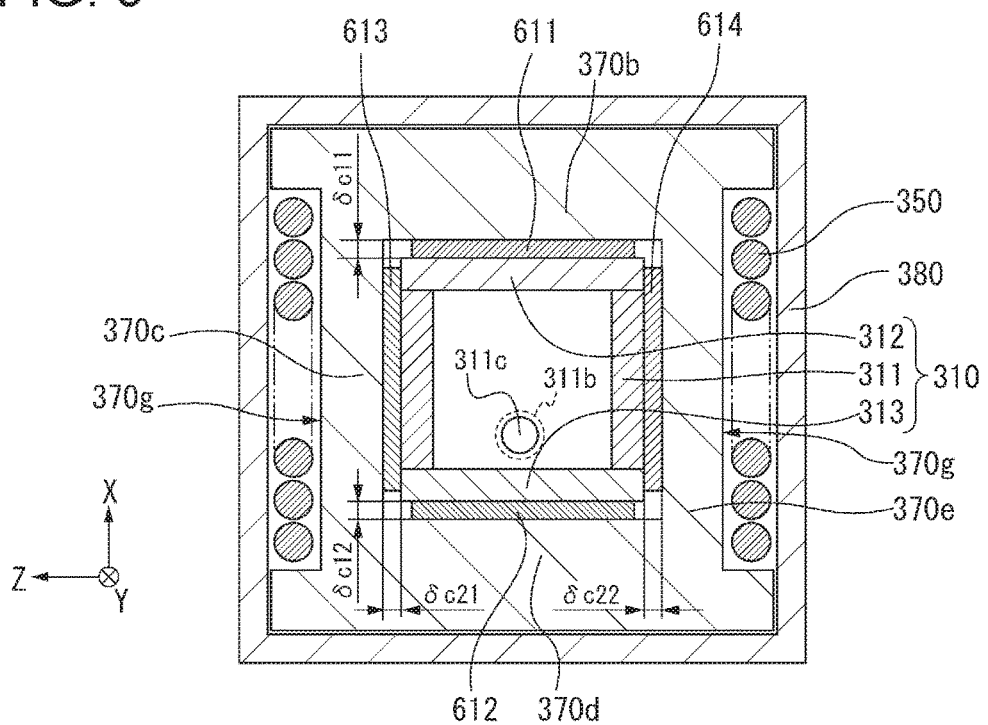
FIG. 9 is a cross-sectional view of a portion taken along line B-B' shown in FIG. 5.

A cross-section of a portion taken along line B-B' shown in FIG. 5 is shown in FIG. 9. As shown in FIG. 9, in addition to the gaps $\delta c11$ and $\delta c12$ mentioned above, a gap $\delta c21$ and a gap $\delta c22$ are also respectively set between the wall portion 370c and the gas cell 310 and between the wall portion 370e and the gas cell 310 in the Z-axis direction. Assuming that a gap in the Z-axis direction in a design stage is $\delta c2$, expressions of $\delta c2 = \delta c21 + \delta c22$, $0 \leq \delta c21 \leq \delta c2$, and $0 \leq \delta c22 \leq \delta c2$ are established.

The heat transmission member 611 is mounted in the gap $\delta c11$, the heat transmission member 612 is mounted in the gap $\delta c12$, a heat transmission member 613 is mounted in the gap $\delta c21$, and a heat transmission member 614 is mounted in the gap $\delta c22$. A material having elasticity and thermal conductivity, for example, silicon rubber, a metal filler-containing rubber, or the like is preferably used for the heat transmission members 611, 612, 613, and 614. That is, in order to transmit heat from the gas cell 310 through the heat transmission members 611, 612, 613, and 614 to the wall portions 370b, 370c, 370d, and 370e, the heat transmission members 611, 612, 613, and 614 can efficiently perform heat transmission by bringing the gas cell 310 and the wall portions 370b, 370c, 370d, and 370e into close contact with each other. Therefore, the heat transmission members 611, 612, 613, and 614 have elasticity, and thus the heat transmission members 611, 612, 613, and 614 can normally operate to press the wall portions 370b, 370c, 370d, and 370e and the gas cell 310 to thereby bring the wall portions and the gas cell into close contact with each other.

In this manner, a loss of heat transmission performed from the gas cell 310 through the heat transmission members 611, 612, 613, and 614 to the wall portions 370b, 370c, 370d, and 370e is reduced as shown by a heat transmission path of the heat Q8 indicated by arrows in FIG. 5 by the heat transmission members 611, 612, 613, and 614 being provided, and thus it is possible to efficiently supply heat.

In addition, the protrusion portion 311b provided in the main body 311 of the gas cell 310 is inserted into the through hole 370h of the light absorbing unit 370, and heat Q9 is transmitted from the protrusion portion 311b through the inner circumferential surface of the through hole 370h to the light absorbing unit 370. In this manner, heat transmitted from the gas cell 310 through each of the paths of the heat Q6, Q7, Q8, and Q9 to the light absorbing unit 370 is transmitted from the light absorbing unit 370 to the magnetic shield 380 in a state where the heat changes to heat Q10, and the heat is radiated to the outside of the magnetic shield 380.

Surplus heat of the gas cell 310 is removed, and the temperature of the gas cell 310 is maintained to a predetermined temperature, thereby allowing the atomic oscillator 100 having a stabilized oscillation property to be obtained.

Figure 10:
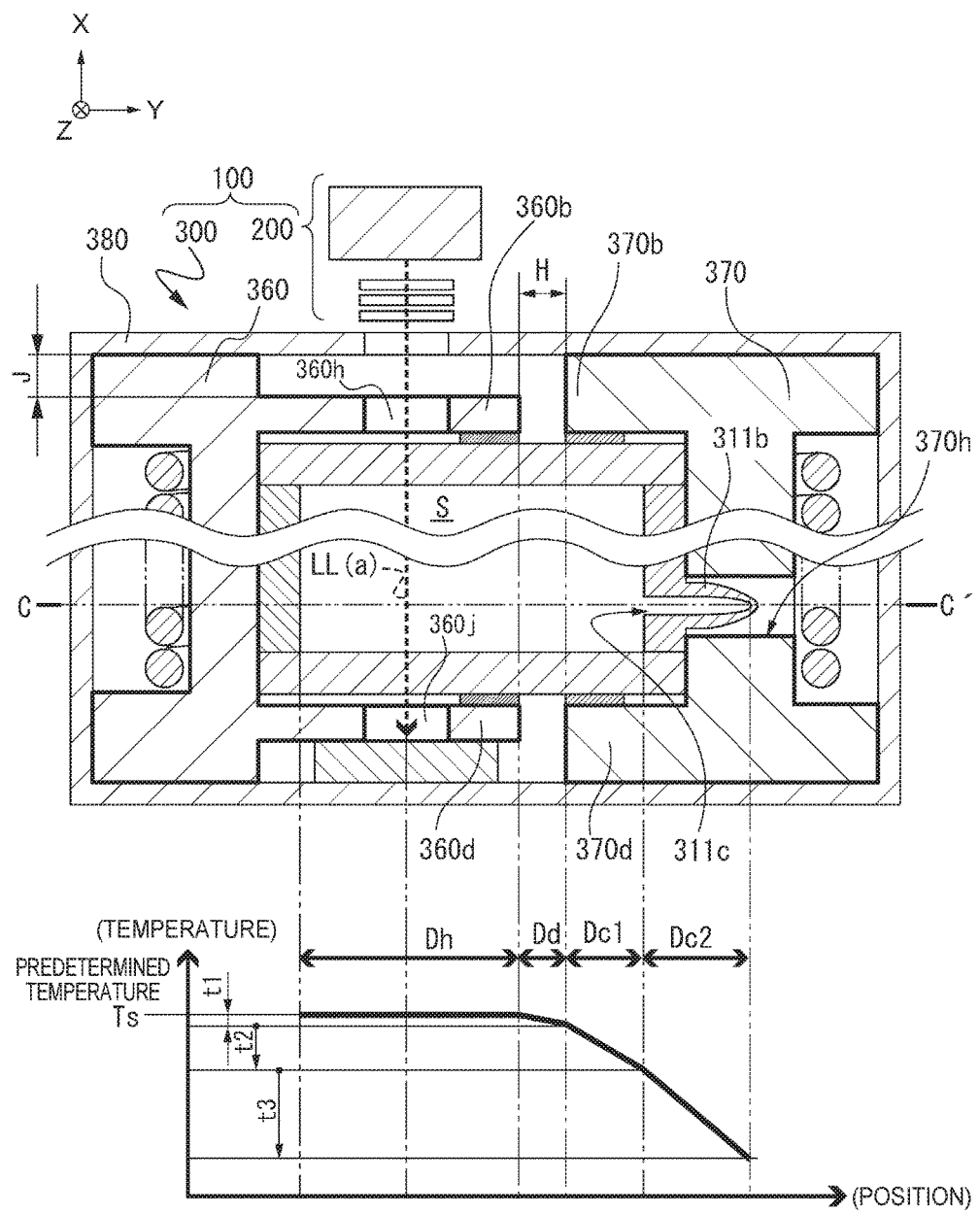
FIG. 10 is a schematic diagram showing inner temperature distribution of a gas cell included in the atomic oscillator according to the first embodiment.

FIG. 10 is a schematic diagram showing inner temperature distribution of the gas cell 310 included in the atomic oscillator 100 shown in FIG. 5 along line C-C'. As shown in FIG. 10, the heat transmission unit 360 and the light absorbing unit 370 are disposed so as to face each other in the Y-axis direction through the gas cell 310. The amount of gas cell 310 inserted into the first concave portion 360f of the heat transmission unit 360 and the first concave portion 370f of the light absorbing unit 370 (see FIGS. 6 and 8) is set so as to separate the wall portions 360b, 360c, 360d, and 360e of the heat transmission unit 360 and the wall portions 370b, 370c, 370d, and 370e of the light absorbing unit 370 from each other, and a separation distance H is provided.

It is possible to prevent heat from being directly transmitted from the heat transmission unit 360 to the light absorbing unit 370 by providing the separation distance H. A region of gas such as air is formed between the wall portions 360b, 360c, 360d, and 360e of the heat transmission unit 360 and the wall portions 370b, 370c, 370d, and 370e of the light absorbing unit 370 by further separating the wall portions from each other, and it is possible to make the region operate as a heat insulating portion. In addition, the wall portions 360b, 360c, 360d, and 360e of the heat transmission unit 360 and the inner wall of the magnetic shield 380 form a space portion J. In the space portion J, gas such as air functions as a heat insulating member, and it is possible to prevent heat from moving from the wall portions 360b, 360c, 360d, and 360e of the heat transmission unit 360 to the magnetic shield 380 and to suppress a loss of heat transmission from the heat transmission unit 360 to the gas cell 310.

The temperature distribution of the gas cell 310 can be maintained to a predetermined temperature Ts at which a desired number of alkali metal atoms can be present in a transmission region of the excitation light LL, that is, in a region Dh which is covered by the wall portions 360b, 360c, 360d, and 360e of the heat transmission unit 360 by heat from the heater 330 which is transmitted from the wall portions 360b, 360c, 360d, and 360e of the heat transmission unit 360 as shown in FIG. 10.

However, in a case where surplus alkali metal atoms are present in the gas cell 310, for example, the alkali metal atoms may condense on the window portions 312 and 313 of the gas cell 310, which leads to a concern for interference with the transmission of the excitation light LL. Consequently, the surplus alkali metal atoms are condensed in a region within the gas cell 310 other than the transmission region of the excitation light LL to thereby stabilize the number of alkali metal atoms in the transmission region of the excitation light LL, and thus the light absorbing unit 370 for forming a condensation region is provided.

In a region Dd, having a separation distance H, which is adjacent to the region Dh covered by the wall portions 360b, 360c, 360d, and 360e of the heat transmission unit 360 in which a predetermined temperature Ts is maintained, heat is radiated from the gas cell 310 to a space portion formed between the wall portions 360b, 360c, 360d, and 360e of the heat transmission unit 360 and the wall portions 370b, 370c, 370d, and 370e of the light absorbing unit 370, and thus the temperature falls by t1 from the predetermined temperature Ts.

Further, in a Dc1 region covered by the wall portions 370b, 370c, 370d, and 370e of the light absorbing unit 370, the wall portions 370b, 370c, 370d, and 370e of the light absorbing unit 370 absorb heat from the gas cell 310 as described above, and thus the temperature falls by t2. Thereby, the Dc1 region covered by the wall portions 370b, 370c, 370d, and 370e of the light absorbing unit 370 is formed as a condensation region for a surplus portion of the alkali metal atoms.

In addition, in a Dc2 region surrounded by the through hole 370h of the light absorbing unit 370 into which the protrusion portion 311b provided in the main body 311 of the gas cell 310 is inserted, heat is further transmitted from the protrusion portion 311b through the through hole 370h to the light absorbing unit 370, and the temperature further falls by t3 than in the Dc1 region, thereby allowing a surplus portion of the alkali metal atoms to be condensed and held in the liquid reserving portion 311c.

The above-mentioned atomic oscillator 100 shown in FIG. 5 is configured such that four heat transmission members 511, 512, 513, and 514 are disposed in respective gaps between the gas cell 310 and the wall portions 360b, 360c, 360d, and 360e of the heat transmission unit 360, but is not limited thereto. FIGS. 11 to 14 are cross-sectional views showing other configurations of the heat transmission members 511, 512, 513, and 514 disposed in respective gaps of the gas cell 310 shown in FIG. 7 and the wall portions 360b, 360c, 360d, and 360e of the heat transmission unit 360, and are diagrams equivalent to a cross section of the portion taken along the line A-A' shown in FIG. 5.

Figure 11:
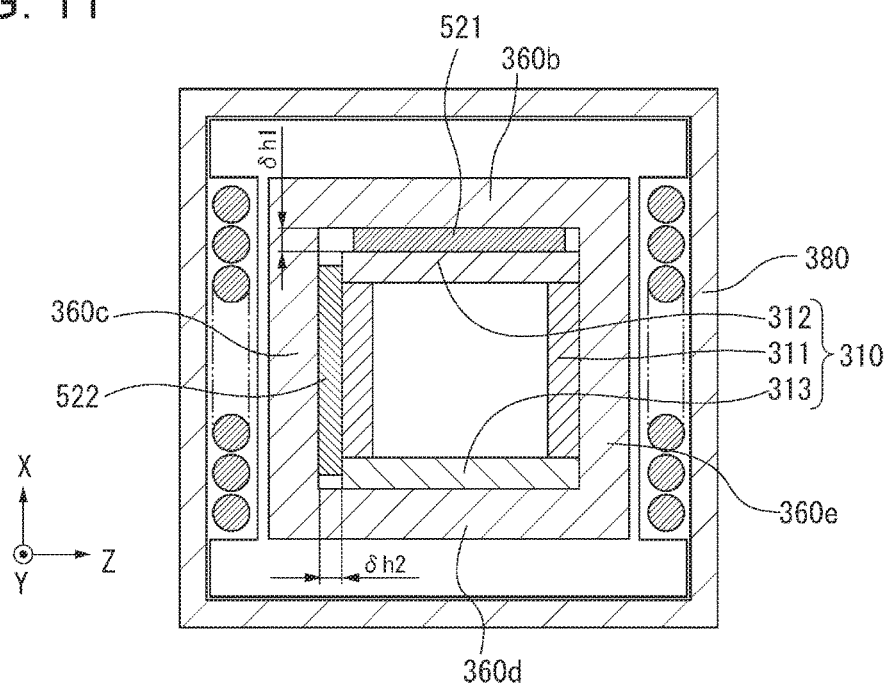
FIG. 11 is a cross-sectional view showing another configuration of a heat transmission member of the atomic oscillator according to the first embodiment.

As shown in FIG. 11, a heat transmission member 521 that presses the gas cell 310 toward the wall portion 360d of the heat transmission unit 360 in the X (−) direction and a heat transmission member 522 that presses the gas cell 310 toward the wall portion 360e of the heat transmission unit 360 in the Z (+) direction may be provided. As shown in FIG. 11, in a case where the heat transmission members 521 and 522 are disposed, a portion of the external surface of the gas cell 310 is in direct contact with the wall portion 360e or the wall portion 360d, thereby securing thermal connection therebetween.

Figure 12:
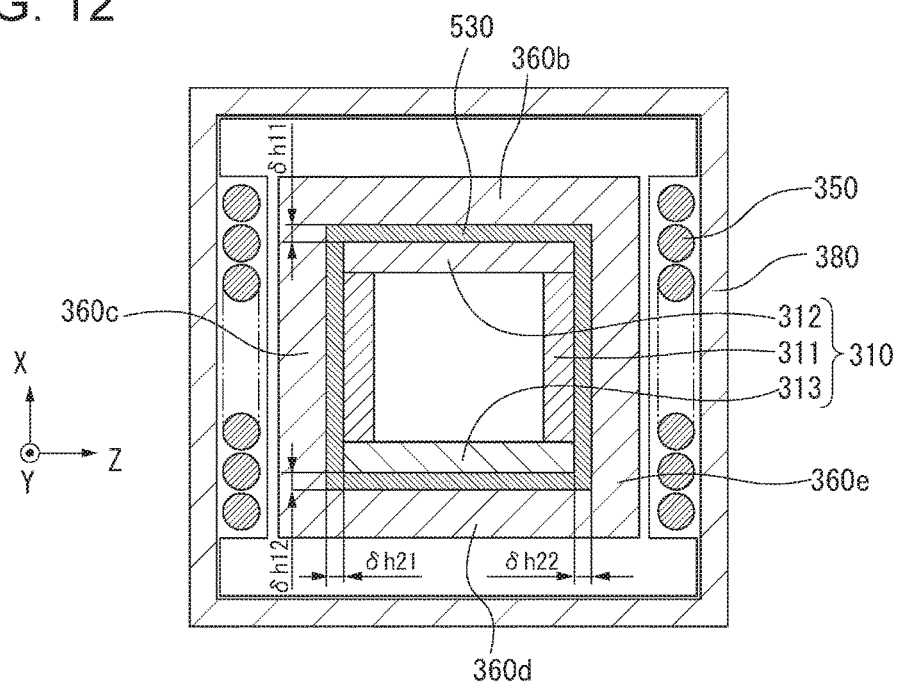
FIG. 12 is a cross-sectional view showing another configuration of the heat transmission member of the atomic oscillator according to the first embodiment.

In a configuration shown in FIG. 7, four components of the heat transmission members 511, 512, 513, and 514 are disposed in the gaps δh11, δh12, δh21, and δh22 formed by the gas cell 310 and the wall portions 360b, 360c, 360d, and 360e of the heat transmission unit 360. However, as shown in FIG. 12, a heat transmission member 530 having a so-called packing configuration in which the heat transmission members 511, 512, 513, and 514 are integrally formed may be adopted. In this manner, it is possible to achieve thermal connection between the gas cell 310 and the wall portions 360b, 360c, 360d, and 360e of the heat transmission unit 360 without an interval by using the integral heat transmission member 530.

Figure 13:
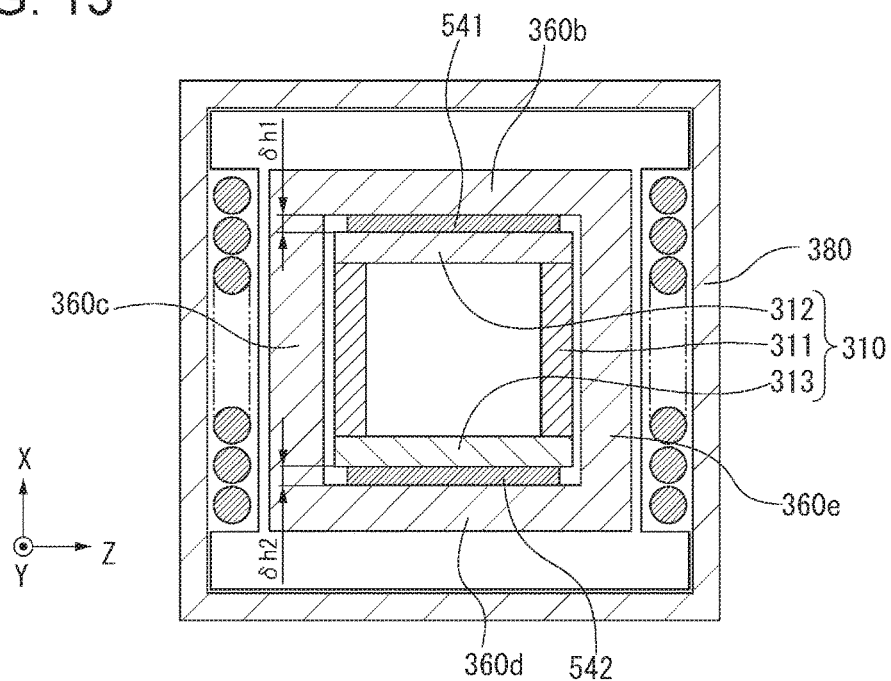
FIG. 13 is a cross-sectional view showing another configuration of the heat transmission member of the atomic oscillator according to the first embodiment.

In a configuration shown in FIG. 13, a heat transmission member 541 is disposed between the wall portion 360b of the heat transmission unit 360 and the window portion 312 of the gas cell 310 in the X-axis direction, and a heat transmission member 542 is disposed between the wall portion 360d of the heat transmission unit 360 and the window portion 313 of the gas cell 310. In other words, the heat transmission members 541 and 542 are interposed between the wall portions 360b and 360d of the heat transmission unit 360 which are disposed so as to face the gas cell 310 in the X-axis direction. In addition, in a configuration shown in FIG. 14, one window portion 313 of the gas cell 310 in the X-axis direction is directly thermally connected to the wall portion 360d of the heat transmission unit 360, and a heat transmission member 550 is disposed between the other window portion 312 and the wall portion 360b of the heat transmission unit 360.

Figure 14:
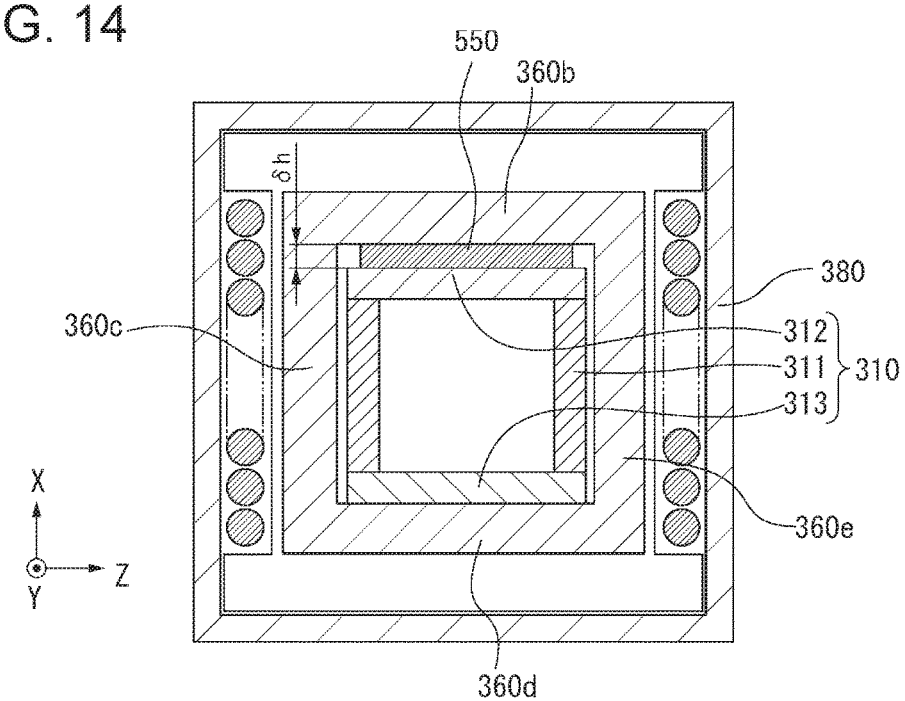
FIG. 14 is a cross-sectional view showing another configuration of the heat transmission member of the atomic oscillator according to the first embodiment.

According to the arrangement of the heat transmission members 541, 542, and 550 shown in FIGS. 13 and 14, although not shown in the drawing, heat is transmitted from the wall portions 360b and 360d of the heat transmission unit 360 to the gas cell 310 in a direction along the optical axis of the excitation light LL shown in FIG. 5, that is, along the X-axis. Therefore, it is possible to effectively heat a transmission region along the optical axis of the excitation light LL even with a smaller number of heat transmission members and to stabilize oscillation characteristics of the atomic oscillator 100.

Although described above, the heat transmission members 511, 512, 513, and 514 shown in FIG. 7, the heat transmission members 521 and 522 shown in FIG. 11, and the heat transmission member 530 shown in FIG. 12 are formed to have a sheet shape using an elastic member having a thermal conductivity, for example, silicon rubber, and thus the members can be interposed between the gas cell 310 and the wall portions 360b, 360c, 360d, and 360e of the heat transmission unit 360. In addition, a rubber-based filler having a thermal conductivity and elasticity by coagulation may be filled between the gas cell 310 and the wall portions 360b, 360c, 360d, and 360e of the heat transmission unit 360 and may be then coagulated.

Other configurations of the arrangement of the heat transmission members in the heat transmission unit 360 have been described. Similarly, in the light absorbing unit 370, heat transmission members (heat transmission members 611, 612, 613, and 614 shown in FIG. 9) may have arrangement configurations shown in FIGS. 11 to 14, similar to the heat transmission unit 360.

Second Embodiment

Figure 15:
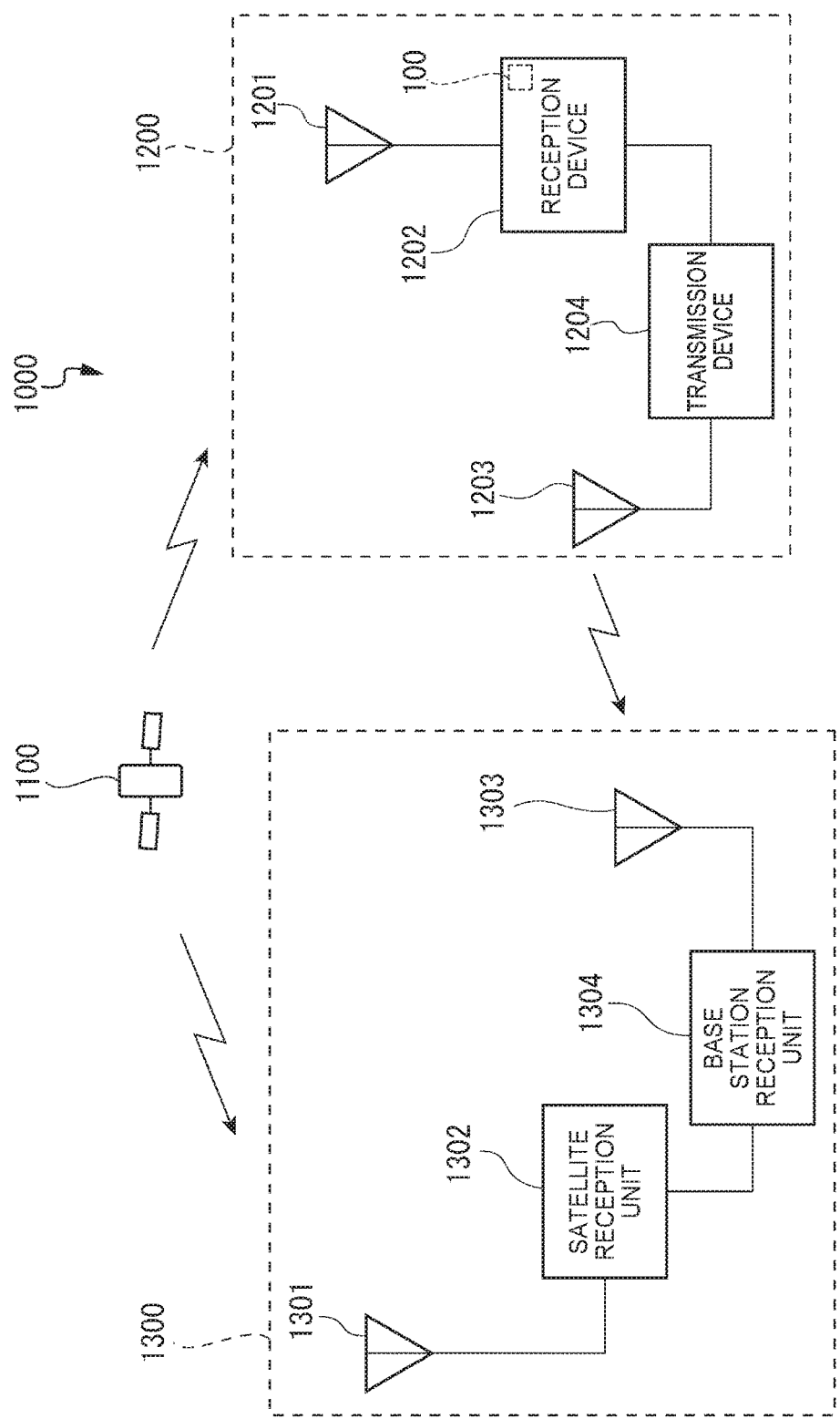
FIG. 15 is a diagram showing a schematic configuration of a positioning system using a GPS satellite as an example of an electronic apparatus according to a second embodiment.

As a second embodiment, a positioning system using a GPS satellite will be described as an example of an electronic apparatus including the atomic oscillator 100 according to the first embodiment. FIG. 15 is a diagram showing a schematic configuration in a case where the atomic oscillator according to the invention is used for the positioning system using a GPS satellite.

A positioning system 1000 shown in FIG. 15 includes a GPS satellite 1100, a base station device 1200, and a GPS reception device 1300. The GPS satellite 1100 transmits positioning information (GPS signal). The base station device 1200 includes a reception device 1202 that receives positioning information from the GPS satellite 1100 with a high level of accuracy through an antenna 1201 installed, for example, at an electronic reference point (GPS continuous observation station), and a transmission device 1204 that transmits the positioning information, which is received by the reception device 1202, through an antenna 1203.

Here, the reception device 1202 is an electronic device including the atomic oscillator 100 mentioned above of the first embodiment according to the invention as the reference frequency oscillation source thereof. The reception device 1202 has excellent reliability. In addition, the positioning information received by the reception device 1202 is transmitted by the transmission device 1204 in real time. The GPS reception device 1300 includes a satellite reception unit 1302 that receives positioning information from the GPS satellite 1100 through an antenna 1301, and a base station reception unit 1304 that receives positioning information from the base station device 1200 through an antenna 1303.

Third Embodiment

Figure 16:
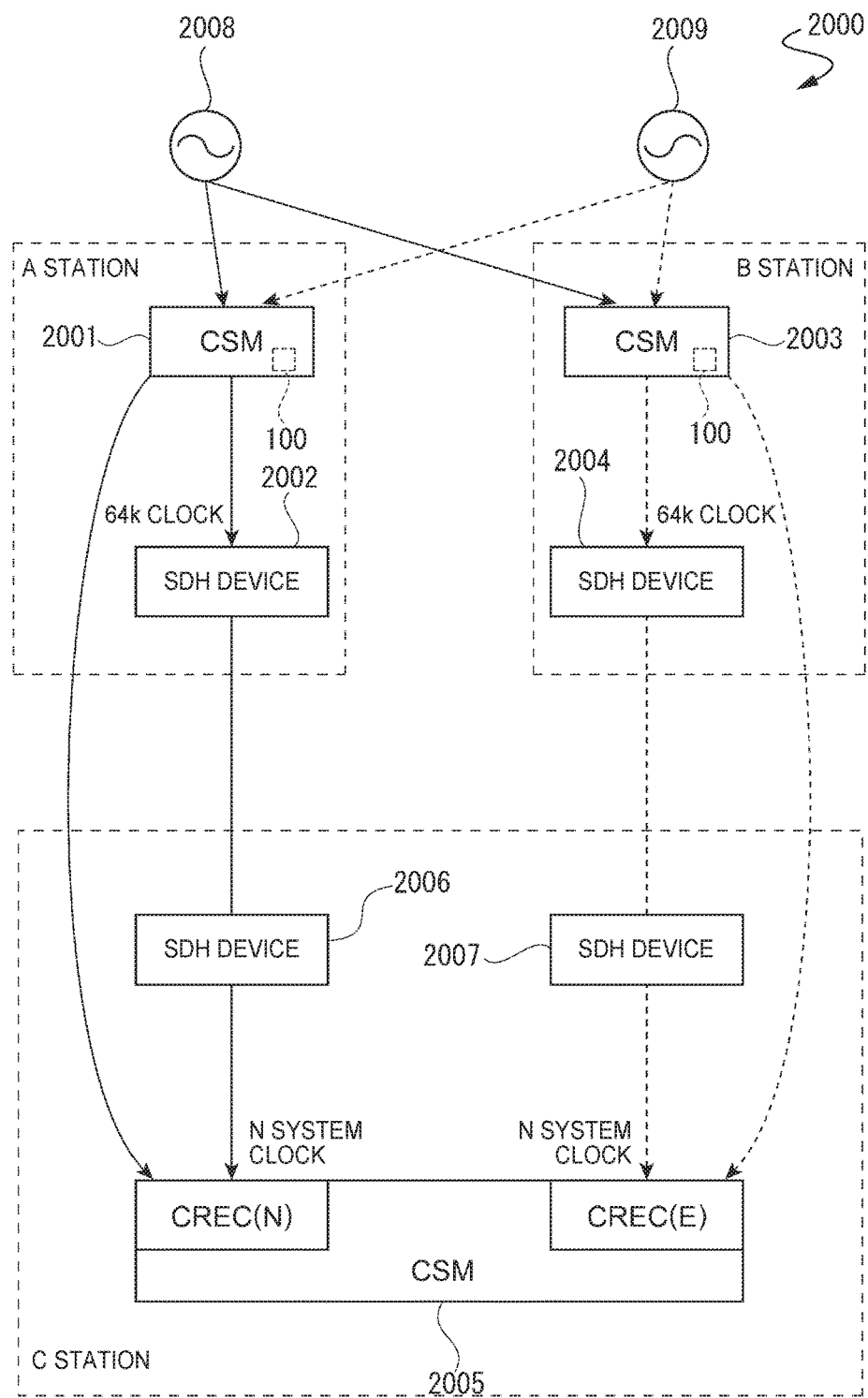
FIG. 16 is a schematic diagram showing a configuration of a clock transmission system as an example of an electronic apparatus according to a third embodiment.

As a third embodiment, a clock transmission system will be described as an example of an electronic apparatus including the atomic oscillator 100 according to the first embodiment. FIG. 16 is a diagram showing a schematic configuration in a case where the atomic oscillator according to the invention is used for a clock transmission system.

A clock transmission system 2000 shown in FIG. 16 conforms clocks of respective devices within a network of a time division multiplex system to each other, and is a system having a redundant configuration of a normal (N) system and an emergency (E) system.

The clock transmission system 2000 includes a clock supply module (CSM) 2001 and a synchronous digital hierarchy (SDH) device 2002 of an A station (upper (N system)), a clock supply module 2003 and an SDH device 2004 of a B station (upper (E system)), and a clock supply module 2005 and SDH devices 2006 and 2007 of a C station (lower). The clock supply module 2001 includes an atomic oscillator 100, and generates a clock signal of the N system. The atomic oscillator 100 in the clock supply module 2001 generates a clock signal in synchronization with a more accurate clock signal applied from master clocks 2008 and 2009 including an atomic oscillator using cesium.

The SDH device 2002 performs the transmission and reception of a main signal on the basis of a clock signal applied from the clock supply module 2001, superimposes the clock signal of the N system on the main signal, and transmits the superimposed signals to the lower clock supply module 2005. The clock supply module 2003 includes an atomic oscillator 100 and generates a clock signal of the E system. The atomic oscillator 100 in the clock supply module 2003 generates a clock signal in synchronization with a more accurate clock signal applied from the master clocks 2008 and 2009 including an atomic oscillator using cesium.

The SDH device 2004 performs the transmission and reception of a main signal on the basis of a clock signal applied from the clock supply module 2003, superimposes the clock signal of the E system on the main signal, and transmits the superimposed signals to the lower clock supply module 2005. The clock supply module 2005 receives clock signals applied from the clock supply modules 2001 and 2003, and generates a clock signal in synchronization with the received clock signal.

Here, the clock supply module 2005 normally generates a clock signal in synchronization with the clock signal of the N system which is applied from the clock supply module 2001. In a case where an abnormality occurs in the N system, the clock supply module 2005 generates a clock signal in synchronization with the clock signal of the E system which is applied from the clock supply module 2003. Switching from the N system to the E system is performed in this manner, and thus it is possible to secure stable clock supply and to increase the reliability of a clock path network. The SDH device 2006 performs the transmission and reception of a main signal on the basis of the clock signal applied from the clock supply module 2005. Similarly, the SDH device 2007 performs the transmission and reception of a main signal on the basis of the clock signal applied from the clock supply module 2005. Thereby, it is possible to synchronize the module of the C station with the module of the A station or the B station.

Fourth Embodiment

Figure 17:
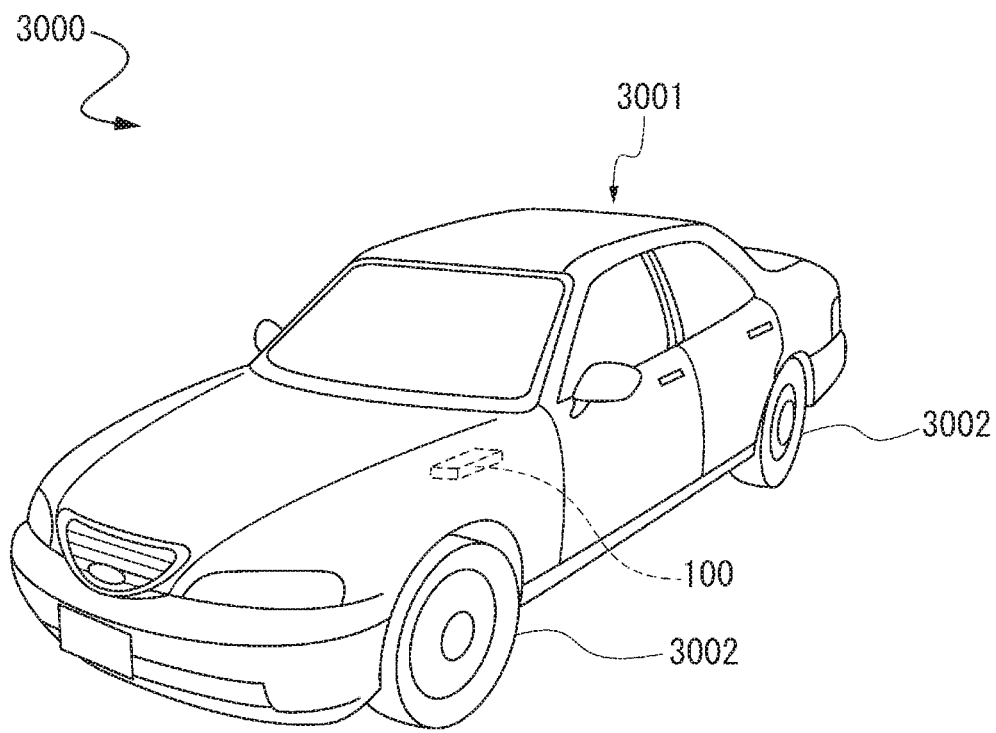
FIG. 17 is a perspective view showing a configuration of a vehicle as an example of a moving object according to a fourth embodiment.

As a fourth embodiment, a vehicle will be described as an example of a moving object including the atomic oscillator 100 according to the first embodiment. FIG. 17 is a perspective view showing a schematic configuration in a case where the atomic oscillator according to the invention is used for the vehicle as a moving object.

A vehicle 3000 as a moving object shown in FIG. 17 includes a vehicle body 3001 and four wheels 3002, and is configured to rotate the wheels 3002 by a power source, not shown in the drawing, which is provided in the vehicle body 3001. The vehicle 3000 has the atomic oscillator 100 built therein. For example, a control unit not shown in the drawing controls the driving of the power source on the basis of an oscillation signal applied from the atomic oscillator 100.

Meanwhile, an electronic apparatus or a moving object having the atomic oscillator according to the invention incorporated therein are not limited to the above-mentioned apparatus or moving object, and can be applied to, for example, a mobile phone, a digital still camera, an ink jet type discharge apparatus (for example, an ink jet printer), a personal computer (a mobile personal computer and a laptop type personal computer), a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, and the like.

As described above, the atomic oscillator according to the invention has been described with reference to the accompanying drawings, but the invention is not limited thereto. For example, a configuration of each unit in the above-described embodiment can be replaced with any configuration exhibiting the same function, and can also have any configuration added thereto. In addition, the invention may have a combination of any configurations of the above-described embodiments.

What is claimed is:

1. An atomic oscillator comprising:
a gas cell that is configured with first and second window members and a wall so that the gas cell has an inner space enclosed by the first and second window members and the wall, metal atoms being sealed in the inner space, the wall having first, second, third, and forth side frames, the third and fourth frames being connected between the first and second frames;
a heater configured to heat the gas cell, the heater being provided at a side directly adjacent to the first side frame of the gas cell;
a heat transmission member that is coupled to the first, third, and forth side frames and the first and second window members so as to thermally connect the heater to the gas cell and to transmit heat generated by the heater to the gas cell;
a heat absorbing member that is coupled to the second, third, and fourth frames and the first and second window members so as to be thermally connected to the gas cell and to absorb heat of the gas cell and dissipate the heat to an outside of the gas cell;
a first thermal conductive elastic member configured to transfer heat, the first thermal conductive elastic member being provided between the heat transmission member and a first outer surface of the gas cell so that the first thermal conductive elastic member is sandwiched therebetween, the first outer surface is configured with the first, third, and forth side frames and the first and second window members; and
a second thermal conductive elastic member configured to transfer heat, the second thermal conductive elastic member being provided between the heat absorbing member and a second outer surface of the gas cell so that the second thermal conductive elastic member is sandwiched therebetween, the second outer surface is configured with the second, third, and forth side frames and the first and second window members,
wherein the heat generated by the heater transmits to the heat absorbing member via the heat transmission member, the first thermal conductive elastic member, the gas cell, and the second thermal conductive elastic member.

2. The atomic oscillator according to claim 1, wherein each of the first and second thermal conductive elastic members is a rubber-based adhesive, a packing, or a sheet piece.

3. The atomic oscillator according to claim 1, wherein each of the first and second thermal conductive elastic members is a rubber-based filler.

4. The atomic oscillator according to claim 1, further comprising:
a coil that generates a magnetic field passing through the gas cell; and
a magnetic shield that accommodates the gas cell, the heat transmission member, the heat absorbing member, and the coil therein,
wherein the heat transmission member and the heat absorbing member are thermally connected to the magnetic shield, and
wherein the heater is thermally connected to an outer side of the magnetic shield.

* * * * *